(12) United States Patent
Usami et al.

(10) Patent No.: US 7,557,447 B2
(45) Date of Patent: Jul. 7, 2009

(54) SEMICONDUCTOR DEVICE AND METHOD FOR MANUFACTURING SAME

(75) Inventors: Tatsuya Usami, Kawasaki (JP); Koichi Ohto, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 11/702,074

(22) Filed: Feb. 5, 2007

(65) Prior Publication Data

US 2007/0182014 A1    Aug. 9, 2007

(30) Foreign Application Priority Data

Feb. 6, 2006    (JP) .............................. 2006-028308

(51) Int. Cl.
*H01L 23/48* (2006.01)
(52) U.S. Cl. .............................. 257/758; 257/E21.575; 438/622; 438/687
(58) Field of Classification Search ......... 438/618–627, 438/628–630, 633, 643–645, 651, 675, 678, 438/902, 906, 687; 257/E21.575, E21.576, 257/E21.585, 758–762
See application file for complete search history.

(56) References Cited

U.S. PATENT DOCUMENTS

| 5,447,887 | A  | * | 9/1995  | Filipiak et al. ............... 438/644 |
| 6,146,988 | A  |   | 11/2000 | Ngo et al. |
| 6,599,827 | B1 |   | 7/2003  | Ngo et al. |
| 6,660,634 | B1 | * | 12/2003 | Ngo et al. ................... 438/687 |
| 2003/0209738 | A1 | | 11/2003 | Ohto et al. |
| 2004/0046261 | A1 | * | 3/2004 | Ohto et al. .................. 257/774 |
| 2004/0075173 | A1 | * | 4/2004 | Chopra ....................... 257/758 |

FOREIGN PATENT DOCUMENTS

| CN | 1457095      |   | 11/2003 |
| JP | 2001144090 A | * | 5/2001  |
| JP | 2002-246391  |   | 8/2002  |

OTHER PUBLICATIONS

Gosset et al., "Integration and characterization of a self-aligned barrier to Cu diffusion based on copper silicide," *Conference Proceedings AMC XIX*, 2004, Materials Research Society, pp. 321-328.
Kerr, "Strengths of Chemical Bonds," in Lide (editor), *CRC Handbook of Chemistry and Physics: A Ready-Reference Book of Chemical and Physical Data*, $73^{rd}$ Edition, 1992, pp. 9-129 to 9-132.

* cited by examiner

*Primary Examiner*—Brook Kebede
(74) *Attorney, Agent, or Firm*—Young & Thompson

(57) ABSTRACT

An improved migration resistance of the interconnect is provided and a diffusion of silicon into the inside of the interconnect is suppressed. A semiconductor device includes a silicon substrate, a first insulating film provided on the silicon substrate and composed of an SiCN film, an SiOC film and an $SiO_2$ film, and a first copper interconnect provided in the first insulating film and essentially composed of a copper-containing metal. An Si—O unevenly distributed layer doped with injected silicon is included in the vicinity of the surface in the inside of the first copper interconnect, and injected atomic silicon at least partially creates Si—O bond.

19 Claims, 16 Drawing Sheets

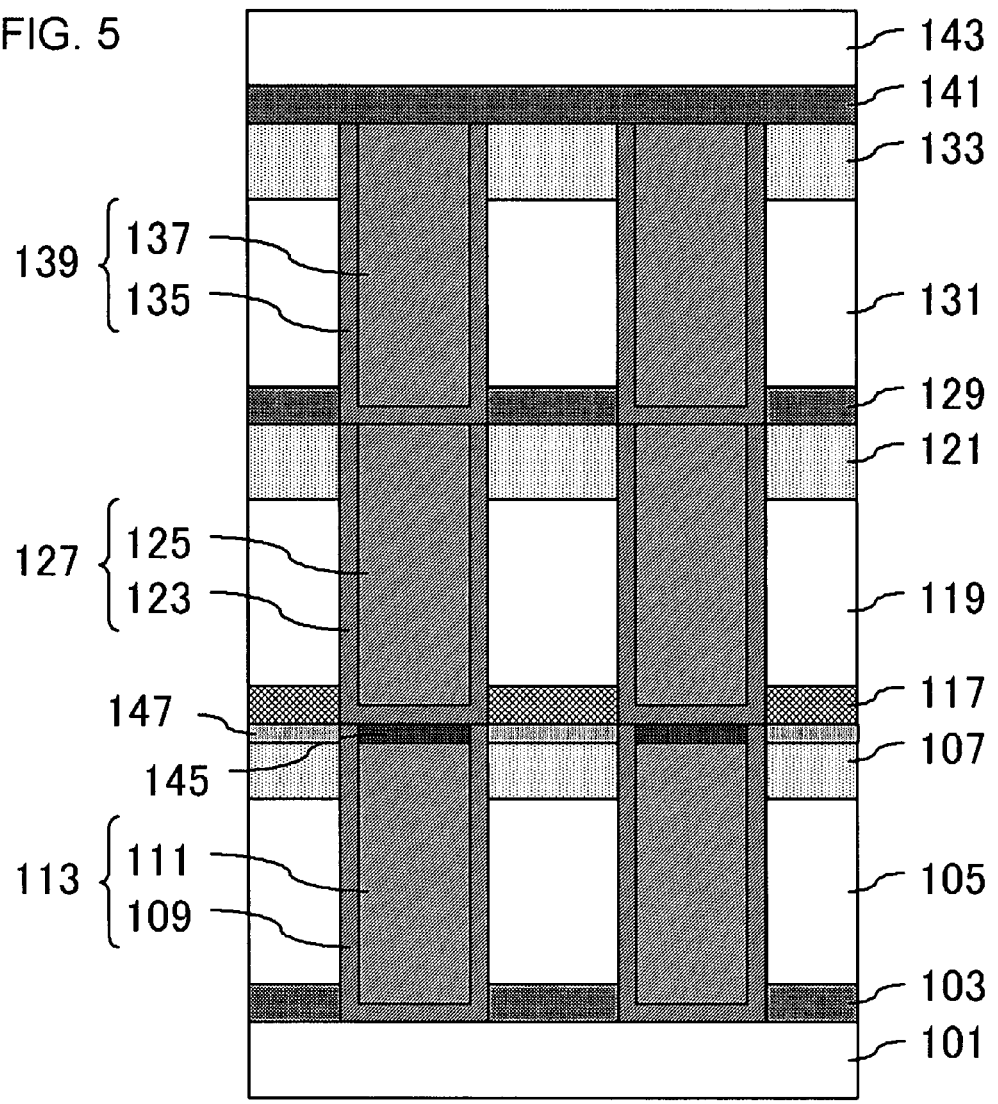

SEMICONDUCTOR DEVICE AND METHOD FOR MANUFACTURING SAME

This application is based on Japanese patent application No. 2006-28,308, the content of which is incorporated hereinto by reference.

BACKGROUND

1. Technical Field

The present invention relates to a semiconductor device and a method for manufacturing thereof, and particularly relates to a semiconductor device, which comprises an interconnect containing a copper-containing metal and a method for manufacturing thereof.

2. Related Art

In recent years, requirements in increasing operation speed of semiconductor devices promotes application of lower resistive materials such as copper and the like for interconnect materials. When a copper-containing metal is employed for an interconnect material, a barrier insulating film for preventing a diffusion of copper (Cu) is provided in a lower layer of an insulating interlayer.

Meanwhile, as the level of the miniaturization of the semiconductor device is progressed, a signal delay due to an increased parasitic capacitance between interconnects is more considerably exhibited, and thus an improvement thereof is expected. To solve the problem, a low dielectric constant film (low-k film) is employed for an insulating interlayer. In addition, a reduced dielectric constant is also required for the above described barrier insulating film.

However, a reduced dielectric constant of the barrier insulating film leads to a decrease of film density of the barrier insulating film. Since a decrease of film density leads to a deterioration of a resistance to oxidization of copper, the surface of the copper interconnect is easily oxidized. There is a concern that this configuration provides a decrease of reliability including an electromigration (EM), a stress induced voiding (SIV) or a time-dependent dielectric breakdown (TDDB) of oxide film.

Typical conventional technologies concerning surface treatment of copper interconnect are described in U.S. Pat. No. 6,146,988, U.S. Pat. No. 6,599,827, Japanese Patent Laid-Open No. 2002-246,391 and Gosset, Laurent G., et al., entitled "Integration And Characterization of A Self-Aligned Barrier to Cu Diffusion Based on Copper Silicide" Conference Proceedings AMC XIX, pp. 321-328, 2004.

U.S. Pat. No. 6,146,988 discloses exposing a surface of a copper interconnect to ammonia plasma.

U.S. Pat. No. 6,599,827 discloses conducting an ammonia plasma-processing and a silane gas processing after a copper interconnect is formed.

Japanese Patent Laid-Open No. 2002-246,391 discloses treating a copper interconnect within a gaseous mixture containing silane gas and ammonia gas under a condition for generating a plasma.

Further, Gosset, Laurent G., et al., entitled "Integration And Characterization of A Self-Aligned Barrier to Cu Diffusion Based on Copper Silicide" Conference Proceedings AMC XIX, pp. 321-328, 2004, discloses conducting a combined processing of an ammonia plasma processing and a silane exposure processing for a copper interconnect.

SUMMARY OF THE INVENTION

However, each of the conventional technologies described above has a room for improvement in view of the following aspects.

First of all, while a reduction of copper in the interconnect is occurred by the ammonia plasma-processing in the technology described in U.S. Pat. No. 6,146,988, reoxidation of the reduced copper is caused in later operation, and therefore there is a concern of deteriorating the migration resistance.

Further, in the technologies described in U.S. Pat. No. 6,599,827, Japanese Patent Laid-Open No. 2002-246,391 and the above-described Gosset, Laurent G., et al., there is a concern that atomic silicon is diffused to an inside of the interconnect, leading to an increase in the resistance of the interconnect. Further, a formation of a copper silicide layer above the interconnect may cause an increase in the resistance thereof. Further, an anomalous reaction is easily progressed during the process for forming the silicide layer, and thus it is difficult to uniformly form the silicide layer having a constant film thickness on the interconnect. Consequently, there is a concern that a production yield is reduced due to a failure in filling or the like caused in the process for forming a connecting plug on the interconnect.

According to one aspect of the present invention, there is provided a semiconductor device, comprising: a substrate; a first insulating film provided on the substrate; and an interconnect, provided in the first insulating film, and essentially composed of a copper-containing metal, wherein the semiconductor device includes a region doped with injected silicon in the vicinity of a surface of the interconnect in the inside of the interconnect, and injected atomic silicon at least partially forms silicon-oxygen (Si—O) bond.

In the semiconductor device of the present invention, the substrate may be a semiconductor substrate.

Also, according to one aspect of the present invention, there is provided a semiconductor device, comprising: a semiconductor substrate; a first insulating film provided on the semiconductor substrate; and an interconnect, provided in the first insulating film, and essentially composed of a copper-containing metal, wherein the semiconductor device includes a region doped with injected silicon in the vicinity of a surface of the interconnect in the inside of the interconnect, and injected atomic silicon at least partially forms silicon-oxygen (Si—O) bond.

A surface of an interconnect composed of a copper-containing metal is commonly easy to be oxidized. The presence of the layer of copper oxide generated by an oxidization of the interconnect surface causes a damage of an adhesiveness between the interconnect and the upper layer, promoting a migration of copper along an elongating direction of the interconnect, thereby reducing the migration resistance. On the contrary, in the semiconductor device of the present invention, the region doped with silicon is provided in the vicinity of the surface of the interconnect in the inside thereof that is essentially composed of the copper-containing metal. Consequently, migration of copper in the vicinity of the surface of the interconnect in the inside thereof is effectively suppressed. Thus, an improved migration resistance can be provided. Further, at least a part of the injected atomic silicon forms Si—O bond in the semiconductor device of the present invention. Consequently, the semiconductor device is configured that a diffusion of injected silicon into the inside of the interconnect silicon is effectively suppressed.

According to another aspect of the present invention, there is provided a method for manufacturing a semiconductor device, including: forming a first insulating film on a substrate; forming an interconnect in the first insulating film, the interconnect being essentially composed of a copper-containing metal; inducing reduction of copper in the vicinity of a surface of the interconnect; injecting silicon in the vicinity of the surface of the interconnect in the inside thereof by exposing an upper portion of the interconnect to a gas containing silicon, after the inducing reduction of copper; and at least partially inducing silicon injected in the injecting silicon to create Si—O bond.

In the method for manufacturing the semiconductor device of the present invention, the substrate may be a semiconductor substrate.

Also, according to another aspect of the present invention, there is provided a method for manufacturing a semiconductor device, including: forming a first insulating film on a semiconductor substrate; forming an interconnect in the first insulating film, the interconnect being essentially composed of a copper-containing metal; inducing reduction of copper in the vicinity of a surface of the interconnect; injecting silicon in the vicinity of the surface of the interconnect in the inside thereof by exposing an upper portion of the interconnect to a gas containing silicon, after the inducing reduction of copper; and at least partially inducing silicon injected in the injecting silicon to create Si—O bond.

In the method for manufacturing the semiconductor device of the present invention, copper oxide in the surface of the interconnect is removed by inducing the reduction of copper in the vicinity of the surface of the interconnect. Then, after the reduction of copper, migration of copper in the surface of the interconnect is suppressed by introducing silicon in the vicinity of the surface of the interconnect. This configuration provides an improved migration resistance of the interconnect. Further, silicon injected in the interconnect is combined with oxygen to form Si—O bond, so that a migration of silicon is restrained in the vicinity of the surface the interconnect, thereby suppressing a diffusion thereof into the inside of the interconnect. Consequently, an increase in resistance of the inside of the interconnect can be effectively suppressed.

As described above, according to the present invention, a migration resistance of an interconnect such as EM resistance and the like can be suppressed while suppressing an increase in a resistance of the interconnect, so that an improved reliability can be provided.

In addition to above, in the present invention, silicon injected in the vicinity of the surface of the interconnect in the inside thereof may be present in a grain boundary of copper, or may be present in a condition that copper in crystal lattice is substituted by silicon.

It is to be understood that the invention is capable of using in various other combinations, modifications and environments, and any other interchanges in the expression between the method and device or the like according to the present invention may be effective as an alternative of an embodiment according to the present invention.

As described above, according to the present invention, silicon is introduced in the vicinity of the surface of the interconnect in the inside thereof essentially composed of a copper-containing metal, and Si—O bond is created from at least some of injected silicon, such that an improved migration resistance of the interconnect can be provided and a diffusion of silicon into the inside of the interconnect can be suppressed.

BRIEF DESCRIPTION OF THE DRAWINGS

The above and other objects, advantages and features of the present invention will be more apparent from the following description taken in conjunction with the accompanying drawings, in which:

FIG. 5 is a cross-sectional view of a semiconductor device, illustrating a configuration of a semiconductor device in the present embodiment;

DETAILED DESCRIPTION

The invention will be now described herein with reference to illustrative embodiments. Those skilled in the art will recognize that many alternative embodiments can be accomplished using the teachings of the present invention and that the invention is not limited to the embodiments illustrated for explanatory purposed.

Preferable embodiments according to the present invention will be described as follows in further detail, in reference to the annexed figures. In all figures, identical numeral is assigned to an element commonly appeared in the figures, and the detailed description thereof will not be repeated.

First Embodiment

Figure 1:
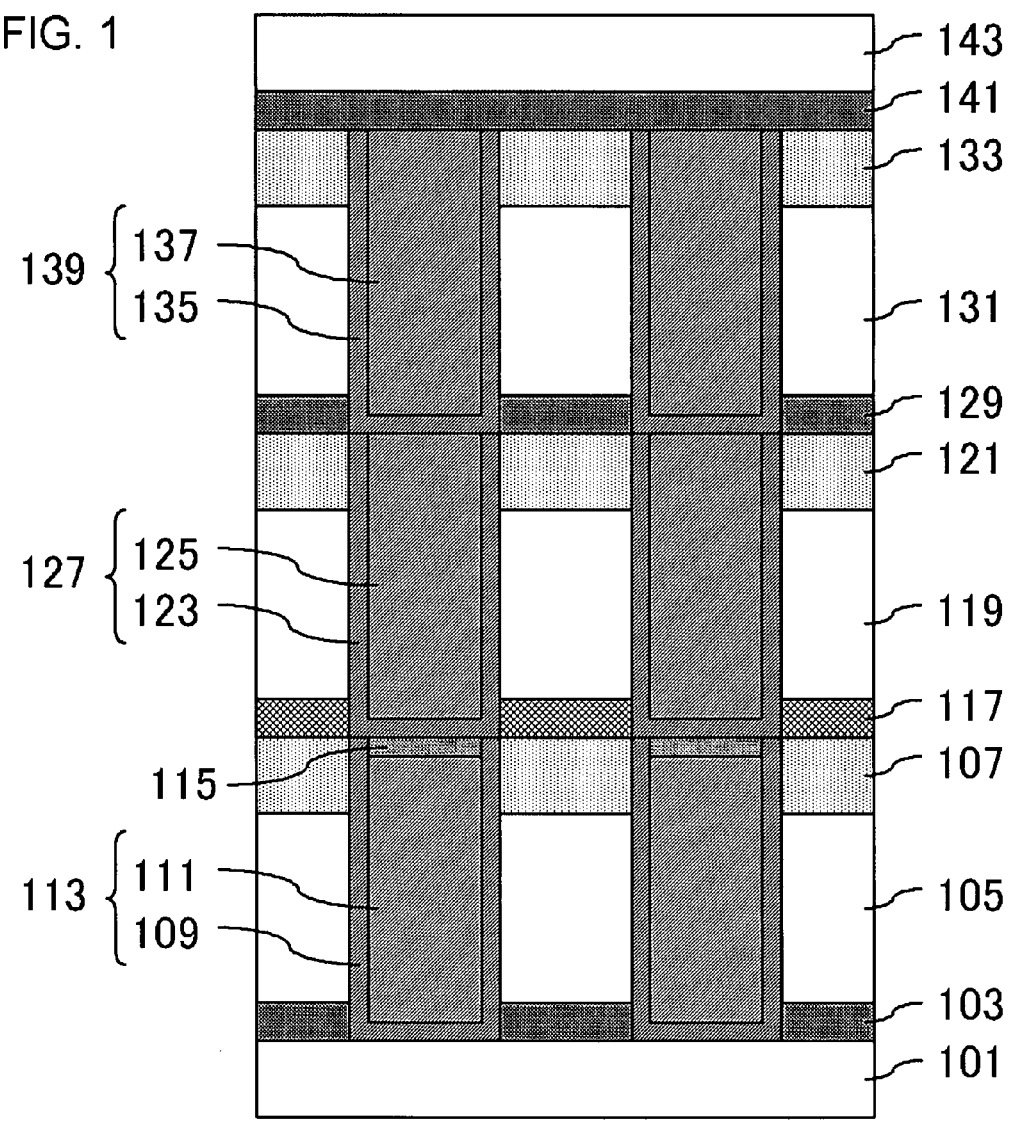
FIG. 1 is a cross-sectional view of a semiconductor device, illustrating a configuration of a semiconductor device in the present embodiment.

FIG. 1 is a cross-sectional view, illustrating a configuration of a semiconductor device of the present embodiment. A semiconductor device 100 shown in FIG. 1 includes a substrate such as a semiconductor substrate (a silicon substrate 101), a first insulating film (an SiCN film 103, an SiOC film 105 and an $SiO_2$ film 107) provided on the silicon substrate 101, and an interconnect (a first copper interconnect 111) provided in the first insulating film and essentially composed of a copper-containing metal. Further, the semiconductor device 100 has a region doped with injected silicon (an Si unevenly distributed layer 153 of FIG. 2C) in the vicinity of the surface in the inside of the first copper interconnect 111, and injected atomic silicon at least partially creates Si—O bond (Si—O unevenly distributed layer 115).

Here, in the following descriptions of the present and the other embodiments, "in the vicinity of the surface of the interconnect in the inside thereof" means in a region in the vicinity of an upper surface of an interconnect, and for example, a region having a thickness of equal to or less than about 10 nm from the upper surface of the interconnect toward the semiconductor substrate. In the present embodiment, the region doped with silicon is provided in the vicinity of the surface in the inside of the first copper interconnect 111 to form a layered structure.

Further, in the semiconductor device 100, silicon injected in the vicinity of the surface in the inside of the first copper interconnect 111 totally forms Si—O bond. This configuration provides further ensured suppression of a diffusion of silicon injected in the first copper interconnect 111 into the inside of the interconnect. This provides, in turn, uneven distribution of silicon having dense-distributed portion in the vicinity of the surface layer of the first copper interconnect 111 can be further ensured.

In the semiconductor device 100, in the vicinity of the surface in the inside of the first copper interconnect 111, ratio of silicon to the whole elements constituting the first copper interconnect 111 is not less than 5 atomic % and not more than 30 atomic %. More specifically, in view of more effectively suppressing an oxidization of copper in the vicinity of the surface of the first copper interconnect 111 to provide further improved migration resistance, ratio of Si contained in the upper surface of the first copper interconnect 111 over a total of Cu, Si, O, C and N contained therein may be, for example, equal to or higher than 5 atomic %, and preferably equal to or higher than 10 atomic %. Further, in view of further effectively suppressing a diffusion of silicon into the first copper interconnect 111, ratio of Si contained in the upper surface of the first copper interconnect 111 over a total of Cu, Si, O, C and N contained therein may be, for example, equal to or lower than 30 atomic %, and preferably equal to or lower than 20 atomic %. In addition to above, ratio of Si contained in the upper surface of the first copper interconnect 111 over a total of Cu, Si, O, C and N contained therein may be measured by employing an x-ray photoelectron spectroscopy (XPS), for example.

Further, in the semiconductor device 100, substantially no Cu—O bond is included in the vicinity of the surface in the inside of the first copper interconnect 111. Here, "substantially no Cu—O bond is included" means that an oxidization of copper in the vicinity of the surface of the first copper interconnect 111 is suppressed so that a decrease in reliability due to EM of copper in the first copper interconnect 111 be reduced to a level on practical use without causing any problem. For example, a typical example thereof may be that a level of Cu—O bond contained therein is lower than a minimum detectable quantity, when Cu—O bond included on the surface of the first copper interconnect 111 is quantitatively analyzed via a XPS process. Alternatively, another typical example thereof may be, for example, that a ratio of an intensity of peak indicating Cu—O bond (around 530.3 eV) over a total of an intensity of a peak indicating Cu—O bond (around 530.3 eV) and an intensity of a peak indicating Si—ON bond (around 532.2 eV) is less than 5%, at a depth of 2 nm from the surface of the first copper interconnect 111, when Cu—O bond included on the surface of the first copper interconnect 111 is quantitatively analyzed via a XPS process.

Further, in the semiconductor device 100, a copper silicide layer is not formed in the vicinity of the surface in the inside of the first copper interconnect 111. In addition to above, even if copper silicide is formed in the upper portion of the first copper interconnect 111 in the following descriptions of the present and the other embodiments, the formed copper silicide having no layered structure is permitted.

The first insulating film is a first insulating interlayer, which is provided by sequentially depositing a silicon carbonitride (SiCN) film 103, a silicon oxycarbide (SiOC) film 105 and a silicon dioxide (SiO$_2$) film 107. Such first insulating interlayer includes the SiOC film 105, which exhibits lower dielectric constant. Besides, the SiO$_2$ film 107 is a plasma oxide film, for example. The first i insulating interlayer is provided with interconnect trenches extending therethrough, and a first interconnect 113 is embedded within each of the interconnect trenches. The first interconnect 113 is composed of a first copper interconnect 111 as described above and a barrier metal film 109 that covers side surfaces and a bottom surface of the first copper interconnect 111.

Further, the semiconductor device 100 includes a second insulating film provided on the first copper interconnect 111 so as to be in contact with the first copper interconnect 111. Such second insulating film may be, for example, a film containing silicon and carbon for a source material of constituent elements for an SiC film, an SiCN film, an SiOC film, a silicon oxycarbonitride (SiOCN) film or the like. In view of further effectively providing a reduced dielectric constant of the insulating interlayer, the specific dielectric constant of the second insulating film may be lower than 4, for example. Meanwhile, in view of more surely suppressing a creation of Cu—O bond in the later operations, the specific dielectric constant of the second insulating film may be higher than 4. In the present and the following embodiments, descriptions will be made focusing on a case employing the SiC film 117 for the second insulating film. The SiC film 117 functions as a barrier insulating film for preventing a diffusion of copper.

A SiOC film 119 and an SiO$_2$ film 121 are provided on the SiC film 117, so as to be in contact therewith in this sequence. The SiC film 117, the SiOC film 119 and the SiO$_2$ film 121 function as the second insulating interlayer. Connecting plugs 127 are embedded within the second insulating interlayer provided so as to be in contact with the first interconnects 113. The connecting plug 127 is composed of a barrier metal film 123, which is provided from a side surface to a bottom surface of a via hole that extends through the second insulating interlayer, and a copper plug 125 provided on the barrier metal film 123.

A third insulating interlayer, which is composed of an SiCN film 129, an SiOC film 131 and an SiO$_2$ film 133 provided so as to be in contact therewith in this sequence, is further provided so as to be in contact with the second insulating interlayer. A second interconnect 139 composed of a barrier metal film 135 and a second copper interconnect 137 is embedded within the third insulating interlayer.

In the semiconductor device 100, an SiCN film 141 and a multiple-layered film 143 are further deposited in this sequence on the third insulating interlayer.

Next, a process for manufacturing the semiconductor device 100 shown in FIG. 1 will be described. A method for manufacturing of semiconductor device 100 contains the following operations:

step 11: forming a first insulating film by depositing the SiCN film 103, the SiOC film 105 and the SiO$_2$ film 107 on the silicon substrate 101 in this sequence;

step 12: forming in the first insulating film the first copper interconnect 111 essentially composed of a copper-containing metal;

step 13: inducing a reduction of copper in the vicinity of the surface of the first copper interconnect 111;

step 14: injecting silicon in the vicinity of the surface in the inside of the first copper interconnect 111 by exposing the upper portion of the first copper interconnect 111 with a gas containing silicon, after the step 13 of inducing a reduction of copper; and step 15: at least partially inducing silicon injected in the step 14 for injecting silicon to create Si—O bond.

The operation of at least partially inducing silicon to create Si—O bond in step 15 may be, for example, partially inducing silicon injected in the vicinity of the surface in the inside of the first copper interconnect 111 to create Si—O bond. This can provide an effective suppression of a reoxidation of copper in the later operations. Further, in the present embodiment, the operation of partially inducing silicon to create Si—O bond in step 15 may include an operation of oxidizing the upper portion of the first copper interconnect 111 (step 16). Further, the oxidation of the first copper interconnect 111 in step 16 may include an operation of heat-treating the silicon substrate 101 having the first copper interconnect 111 formed thereon (step 17).

In addition, after the operation of partially inducing silicon to create Si—O bond in step 15, an operation of forming the second insulating film so as to be in contact with the first insulating film having the first copper interconnect 111 formed therein (step 18). The step 18 includes an operation for forming, for example, an SiC film, an SiCN film, an SiOC film, an SiOCN film or a silicon nitride (SiN) film, and the present embodiment includes an operation for forming SiC film 117.

FIG. 2A to FIG. 2C and FIG. 3A to FIG. 3C are cross-sectional views, illustrating a process for manufacturing of the semiconductor device 100. A process for manufacturing the semiconductor device 100 by employing a single damascene process will be described in detail in reference to these figures as follows.

Figure 2A:
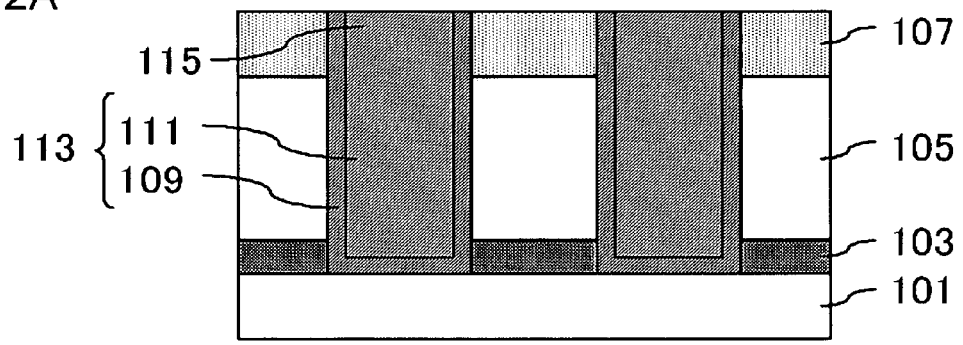
FIGS. 2A to 2C are cross-sectional views of the semiconductor device, illustrating a process for manufacturing of the semiconductor device of FIG. 1.

First of all, as shown in FIG. 2A, the SiCN film 103 serving as an SiC-containing barrier insulating film is formed on the silicon substrate 101 having elements such as transistors (not shown) formed thereon. Then, the SiOC film 105 and the SiO$_2$ film 107 are consecutively deposited on the SiCN film 103. Thereafter, predetermined regions of the SiO$_2$ film 107 and the SiOC film 105 are selectively removed by employing a lithographic technology, and then, the SiCN film 103 is further etched back to form an interconnect trench.

Next, a tantalum (Ta)-containing metallic film serving as a barrier metal film 109, for example, is formed. Then, a Cu seed film (not shown) is formed via a sputter process. Further, a Cu-plated film is formed to plug the interconnect trench by employing a plating technology. Then, the Cu plated film formed above the SiO$_2$ film 107 is removed by employing a chemical mechanical polishing (CMP) technology to obtain the first copper interconnect 111 filled within the interconnect trench.

Figure 2B:
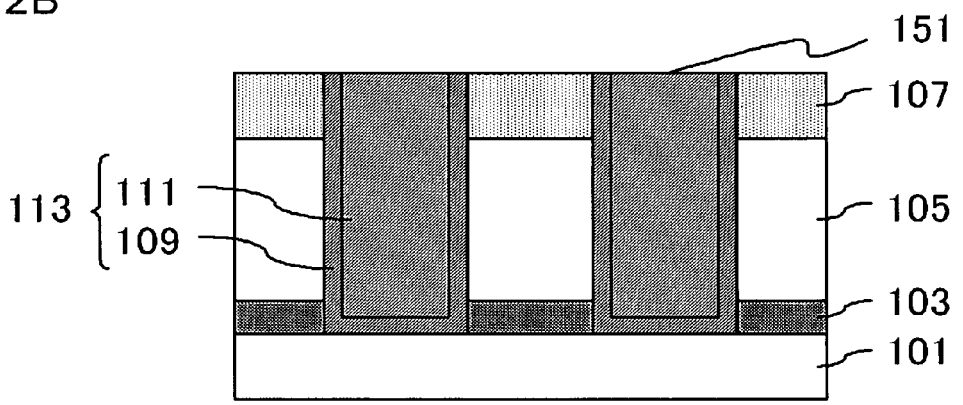

Subsequently, as shown in FIG. 2B, a reduction processing of a copper interconnect-exposed surface 151 of the first copper interconnect 111 is conducted to achieve a reduction of copper existing in the vicinity of the surface of the first copper interconnect 111. The reduction processing may be conducted by, for example, exposing the upper portion of the interconnect with a gas containing hydrogen under a condition for generating a plasma. More specifically, a hydrogen plasma (H$_2$—P) processing or an ammonia plasma (NH$_3$—P) processing for the surface of the first copper interconnect 111 may be employed. Alternatively, a thermal processing within a gas atmosphere containing hydrogen may be additionally nominated.

Figure 2C:
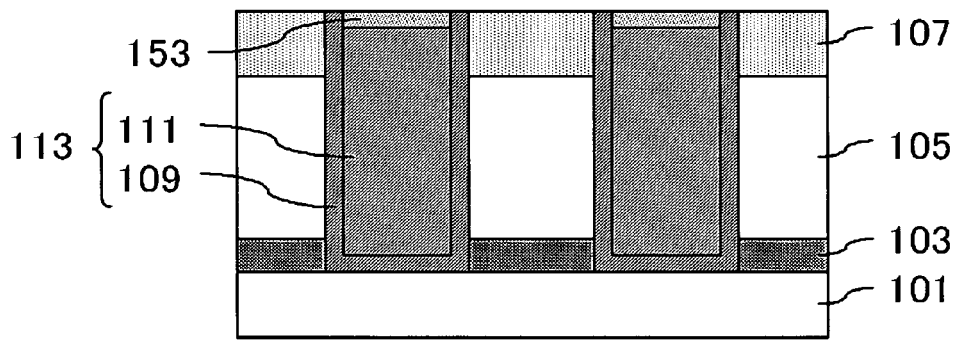

Then, as shown in FIG. 2C, silicon is injected in the vicinity of the surface in the inside of the first copper interconnect 111 from the copper interconnect-exposed surface 151 to form an Si unevenly distributed layer 153. For example, the entire upper surface of the SiO$_2$ film 107 having the first copper interconnect 111 formed therein and the upper portion of the interconnect are exposed to a gas containing silicon under a condition for generating no plasma. Typical gas containing silicon may be, for example, a silane-containing gas such as monosilane (SiH$_4$) and the like. Silicon is injected under a condition for generating no plasma, such that an excessive injecting of silicon into the first copper interconnect 111 is suppressed, thereby selectively injecting silicon in the vicinity of the surface of the first copper interconnect 111. Further, in such case, a heating temperature of the silicon substrate 101 may be, for example, equal to or lower than 300 degree C., and preferably equal to or lower than 200 degree C., such that a formation of a copper silicide layer can be more surely suppressed.

In the present embodiment, injected atomic silicon forms Si—O bond in the later operations, which is then maintained in the vicinity of the surface of the first copper interconnect 111. Consequently, even if silicon is doped with relatively higher concentration, a diffusion of injected silicon into the inside of the interconnect can be suppressed. Thus, silicon concentration in a gas employed for exposing the first copper interconnect 111 can be relatively increased.

A thickness of the Si unevenly distributed layer 153 may be, for example, not less than 0.5 nm and not more than 10 nm. Further, the thickness of the Si unevenly distributed layer 153 may be, for example, equal to or larger than 2 nm, in view of providing a further improved migration resistance of the interconnect. On the other hand, the thickness of the Si unevenly distributed layer 153 may be, for example, equal to or shorter than 2 nm, in view of providing a further suppression of an increase in the electrical resistance of the interconnect.

Figure 3A:
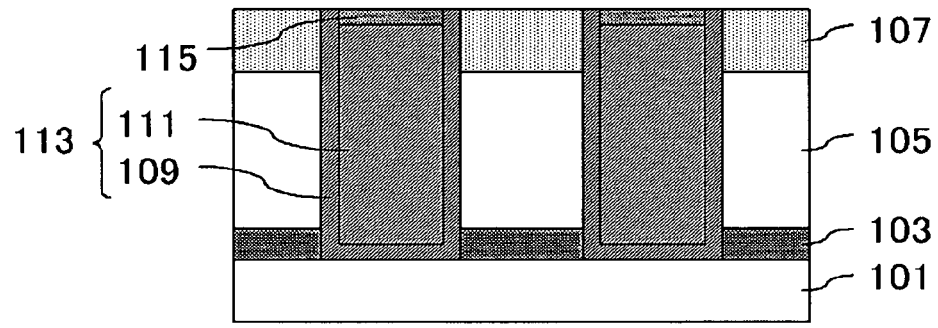
FIGS. 3A to 3C are cross-sectional views of the semiconductor device, illustrating a process for manufacturing of the semiconductor device of FIG. 1.

Subsequently, as shown in FIG. 3A, the copper interconnect exposed surface 151 doped with injected silicon is oxidized so that injected silicon at least partially create Si—O bond. Having such procedure, at least a portion of the Si unevenly distributed layer 153 forms the Si—O unevenly distributed layer 115. In addition to above, FIG. 3A illustrates a case of forming the whole Si unevenly distributed layer 153 into the Si—O unevenly distributed layer 115. When the Si—O unevenly distributed layer 115 is formed, one oxygen may bind to one silicon, or two or more oxygen may bind to one silicon. Silicon injected in the first copper interconnect 111 forms Si—O bond, so that injected silicon is restrained within a region in the vicinity of the surface of the first copper interconnect 111, a diffusion thereof into the first copper interconnect 111 can be avoided in the later operation.

Further, although reduced copper is present in the vicinity of the copper interconnect exposed surface 151 during such oxidation process, Si—O bond is preferentially formed since silicon is more reactive with oxygen than copper. Further, it is more preferable if a measure for substantially avoiding a formation of Cu—O bond is utilized.

Further, it is configured in such operation that silicon injected in the vicinity of the surface in the inside of the first copper interconnect 111 partially forms Si—O bond. This can provide a condition where excessive silicon is remained therein, and therefore excessive silicon preferentially forms Si—O when the first copper interconnect 111 is exposed to an atmosphere for being oxidized in the later operation, thereby providing further ensured prevention from creating Cu—O.

Alternatively, it is configured in such stage that injected silicon partially has dangling bond that is capable of being bound with oxygen in later operation. More specifically, it is configured in the oxidizing process that any of dangling bonds out of four for all of silicon injected in the first copper interconnect 111 remains. Having such configuration, oxidization of silicon injected in the first copper interconnect 111 is preferentially induced in the later operation, so that a reoxidation of copper in the later operation is more effectively suppressed.

In addition to above, typical process for oxidizing copper interconnect exposed surface 151 includes, more specifically, a process for oxidizing the silicon substrate 101 having the first copper interconnect 111 formed therein at a temperature of, for example, not lower than 250 degree C. and not higher than 350 degree C. within an atmosphere having oxygen partial pressure of, for example, equal to or higher than $1 \times 10^{-6}$ atm, and preferably equal to or higher than $1 \times 10^{-5}$ atm. Having the heating temperature of equal to or higher than 250 degree C., an oxidization of atomic silicon injected in the vicinity of the surface of the first copper interconnect 111 can be ensured. Besides, having the heating temperature of equal to or lower than 350 degree C., a damage for electrical elements formed on the first copper interconnect 111 and on the silicon substrate 101 is suppressed, thereby providing a further improved manufacturing stability.

Figure 3B:
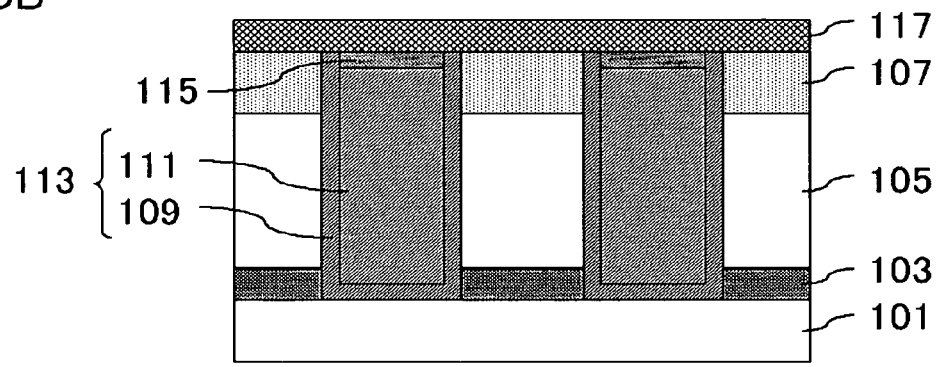

After the oxidation process, as shown in FIG. 3B, the SiC film 117 that functions as a barrier insulating film for the connecting plug 127 is formed on the entire upper surface of the $SiO_2$ film 107. In forming the SiC film 117, a predetermined heat treatment process may be conducted after the deposition. Since silicon is present in the vicinity of the surface in the inside of the first copper interconnect 111 in the present embodiment, oxidization of silicon in the first copper interconnect 111 is preferentially induced, so that a reoxidation of copper is more effectively suppressed, even if, for example, the first copper interconnect 111 is oxidized via a heat treatment process. Alternatively, it is configured that the whole Si unevenly distributed layer 153 forms the Si—O unevenly distributed layer 115 at a stage when the operation of forming the SiC film 117 is completed, leading to providing a further effective prevention from a diffusion of silicon into the inside of the interconnect.

Figure 3C:
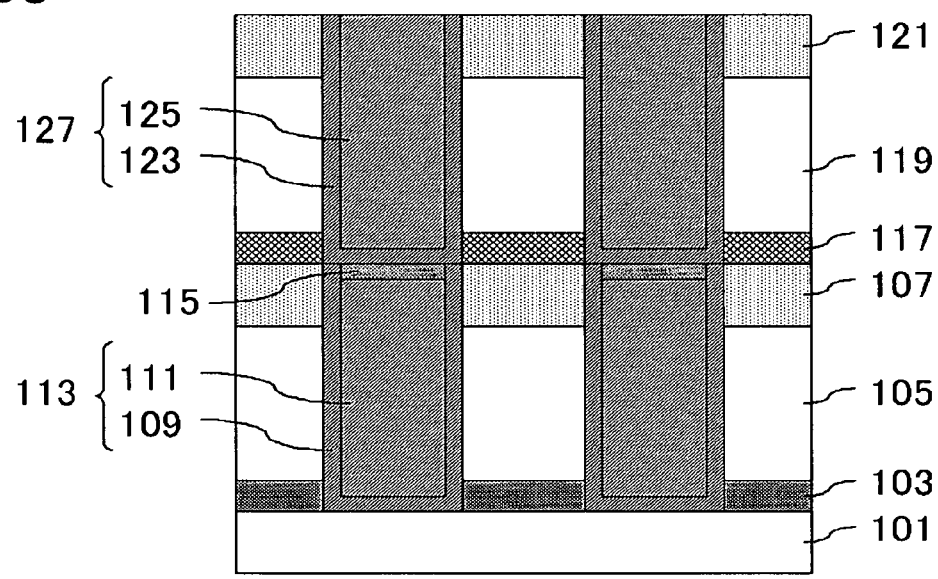

Further, as shown in FIG. 3C, the SiOC film 119 and the $SiO_2$ film 121 are consecutively formed on the SiC film 117. Then, predetermined regions of the $SiO_2$ film 121, the SiOC film 119 and the SiC film 117 are selectively removed to form via holes immediately above the first interconnects 113. Then, the barrier metal film 123 and a Cu plated film are consecutively formed in the via holes by employing a process similar to that for forming the first copper interconnect 111 to obtain the connecting plugs 127 for coupling to the first copper interconnect 111.

Thereafter, the SiCN film 129, the SiOC film 131 and the $SiO_2$ film 133 are consecutively formed on the $SiO_2$ film 121 to form a second interconnect 139 within these films, which provides a coupling to the connecting plug 127. Further, an SiCN film 141 and a multiple-layered film 143 are consecutively formed on the $SiO_2$ film 133. According to the above-mentioned procedure, the semiconductor device 100 shown in FIG. 1 is obtained.

Next, advantageous effects obtainable by employing the configuration of the present embodiment will be described.

In the present embodiment, the Si—O unevenly distributed layer 115 containing silicon with uneven distribution is formed in the vicinity of the surface in the inside of the first copper interconnect 111. Consequently, migration of copper along a direction of an elongation of the first copper interconnect 111 in the interconnect is suppressed, thereby providing an improved migration resistance. Further, unevenly distributed silicon forms Si—O bond in the Si—O unevenly distributed layer 115 containing silicon with uneven distribution. Consequently, injected silicon is maintained in the vicinity of the surface of the first copper interconnect 111, thereby providing an suppression of a diffusion of silicon into the first copper interconnect 111. This configuration provides an suppression of an increase in electrical resistance of the first copper interconnect 111.

Further, in the present embodiment, the Si unevenly distributed layer 153 containing silicon with uneven distribution is formed in the vicinity of the surface in the inside of the first copper interconnect 111. The Si unevenly distributed layer 153 functions as a barrier layer for suppressing an oxidization of atomic copper in the vicinity of the surface in the inside of the first copper interconnect 111. Then, in the step 15, silicon injected in the first copper interconnect 111 is partially forms Si—O bond and unreacted silicon is remained therein as a form of excessive silicon, so that an oxidization of copper contained in the first copper interconnect 111 in the process for forming the upper layer that is in contact with $SiO_2$ film 107 can be effectively prevented. Consequently, it can be configured that an oxidization of reduced copper in the first copper interconnect 111 can be avoided in the later manufacturing process. Since a creation of Cu—O bond in the vicinity of the surface of the first copper interconnect 111 is suppressed, EM or the like can be effectively suppressed, thereby providing an improved reliability of the semiconductor device 100.

Figure 15:
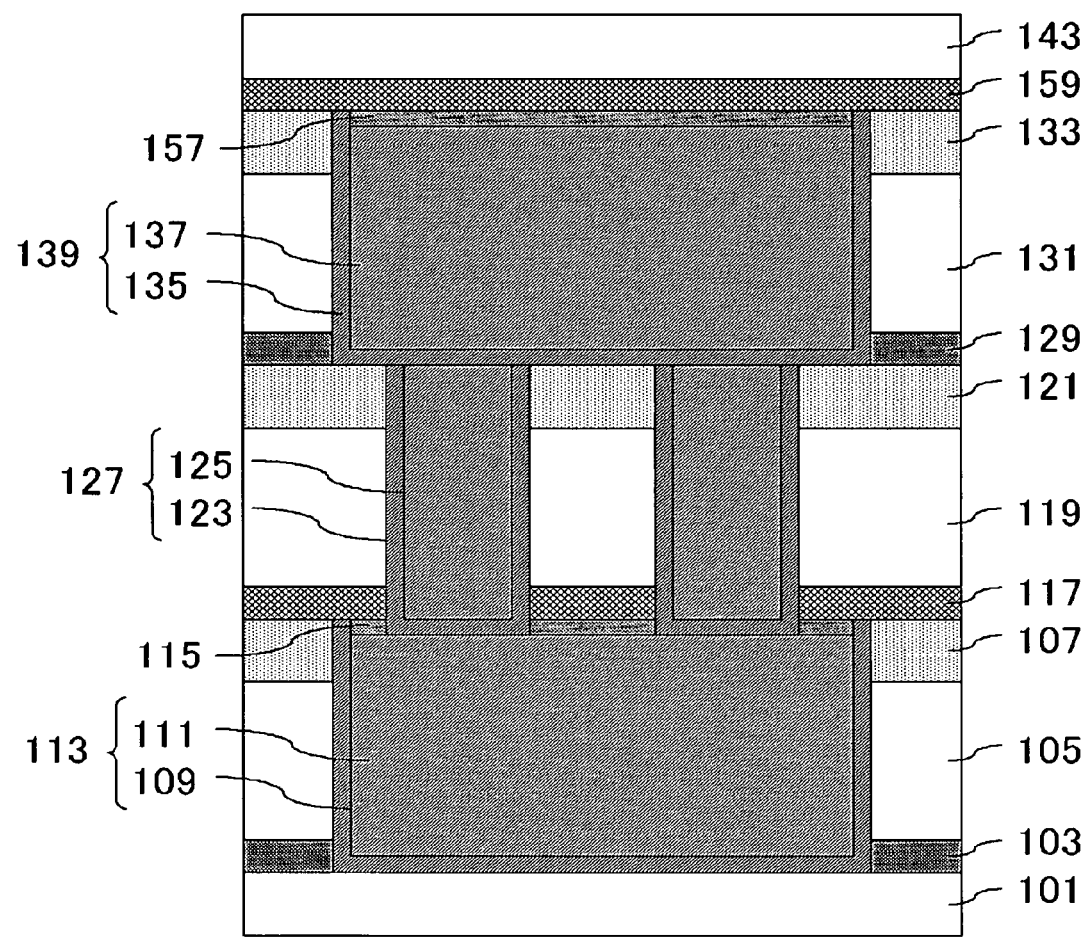
FIG. 15 is a cross-sectional view of a semiconductor device, illustrating a configuration of a semiconductor device in the present embodiment.

In addition to above, since the Si—O unevenly distributed layer 115 is present between the connecting plug 127 and the first copper interconnect 111 in the present embodiment, an electromigration (EM) can be further suppressed as compared with the semiconductor device described in fourth embodiment as discuss later (FIG. 15).

Here, it is assumed that silicon is more preferentially oxidized than copper in the interconnect because binding energy of silicon with oxygen is larger than binding energy of copper with oxygen. It is described in Kerr, J. A., "Strengths of Chemical Bonds" CRC Handbook of Chemistry and Physics 73rd Edition, pp. 9-131 to 9-132, 1992-1993, that binding energy of Si—O bond is 191.1+/−3.2 kcal/mol while binding energy of Cu—O is 64.3+/−5.0 kcal/mol. It is assumed that, since silicon exhibiting larger binding energy with oxygen than copper is present in the vicinity of the interconnect in the inside of the interconnect, silicon more preferentially binds with oxygen than copper when the interconnect surface is oxidized in later operation, thereby providing a prevention from an oxidization of copper.

Further, in the present embodiment, silicon injected in the first copper interconnect 111 forms Si—O bond in the oxidation process. Having such procedure, a remaining excessive silicon in the Si unevenly distributed layer 153 can be prevented in the completion of the semiconductor device 100 while suppressing oxidization of copper. Consequently, excessively injected silicon remains therein, so that a diffusion of silicon in the inside of the first copper interconnect 111 can be suppressed. Consequently, an increase in the electrical resistance of the first copper interconnect 111 is suppressed. Such advantageous effects are considerably exhibited when silicon in the Si—O unevenly distributed layer 115 substantially totally forms Si—O bond, at a stage when the operation of forming the SiC film 117 is completed.

Next, the configuration of the semiconductor device 100 will be further described by comparing with other configurations. As "other configuration", a semiconductor device containing no silicon injected in the first copper interconnect 111 and provided with an SiON film in place of the SiC film 117 is assumed. In this case of "other configuration", in the operation for forming the SiON film on the first copper interconnect 111, the surface of the first copper interconnect 111 is exposed to Si—O and Si—N grown in gas phase. Consequently, the Si unevenly distributed layer 153 and the Si—O unevenly distributed layer 115 are not formed in the inside of the first copper interconnect 111 unlikely as in the configuration of the present embodiment, and a layer containing Si—O bond and Si—N bond is formed above the first copper interconnect 111. Further, since silicon is not injected in the first copper interconnect 111 in such "other configuration", there is a concern that unwanted oxidization of the surface of the first copper interconnect 111 is occurred in the process for depositing the SiON film or the like.

Further, in such "other configuration", a copper silicide layer is normally formed in the process for forming the SiON film. Control of a reaction for forming copper silicide is relatively difficult, and thus an anomalous reaction is easily caused depending on the process conditions, and therefore there is a concern that the copper silicide layer is not uniformly formed. If copper silicide is not uniformly formed, filling failure in forming the connecting plug formation may be caused. Further, the formation of the copper silicide layer causes an increase in the electrical resistance of the interconnect. As described above, generation of the copper silicide layer may lead to a decrease in the production yield.

On the contrary, according to the present embodiment, the Si unevenly distributed layer 153 is stably formed in the vicinity of the surface of the first copper interconnect 111 and an oxidization of copper in the first copper interconnect 111 is effectively suppressed. Further, since the injection of silicon to the first copper interconnect 111 is conducted at a lower temperature of, for example, equal to or lower than 300 degree C. in the present embodiment, a formation of the copper silicide layer on the upper portion of the first copper interconnect 111 can be suppressed. Consequently, an improved manufacturing stability for the connecting plug 127 is provided, and an increase in the coupling resistance between the connecting plug 127 and the first interconnect 113 is suppressed.

In the following embodiments, descriptions will be made focusing on differences from configuration of the first embodiment.

Second Embodiment

While the SiC film 117 is formed on the first copper interconnect 111 after oxidation of silicon injected in the first copper interconnect 111 is conducted in the first embodiment, the procedure may also be conducted with reverse sequential order. In the present embodiment, a procedure in manufacturing the semiconductor device 100 will be described, which includes: injecting silicon in the first copper interconnect 111, and then first forming the SiC film 117, and thereafter oxidizing silicon injected in the first copper interconnect 111.

A manufacturing process of the present embodiment includes an operation (step 19) for forming the second insulating film so as to be in contact with the first insulating film having the first copper interconnect 111 formed therein, after the step 14 for injecting silicon and before the step 15 for creating Si—O bond. The second insulating film may be, for example, a film described in the first embodiment. In the present embodiment, the SiC film 117 being in contact with the first insulating film is formed as the second insulating film. In addition, the step 15 for creating Si—O bond includes an operation (step 20) for diffusing oxygen in the vicinity of the surface of the first copper interconnect 111 through the SiC film 117.

Figure 4A:
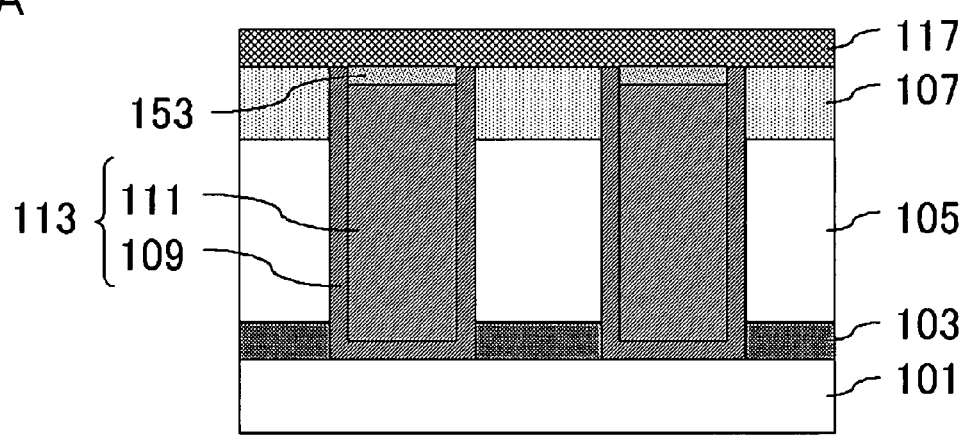
FIGS. 4A and 4B are cross-sectional views of the semiconductor device, illustrating a process for manufacturing of the semiconductor device of FIG. 1.
Figure 4B:
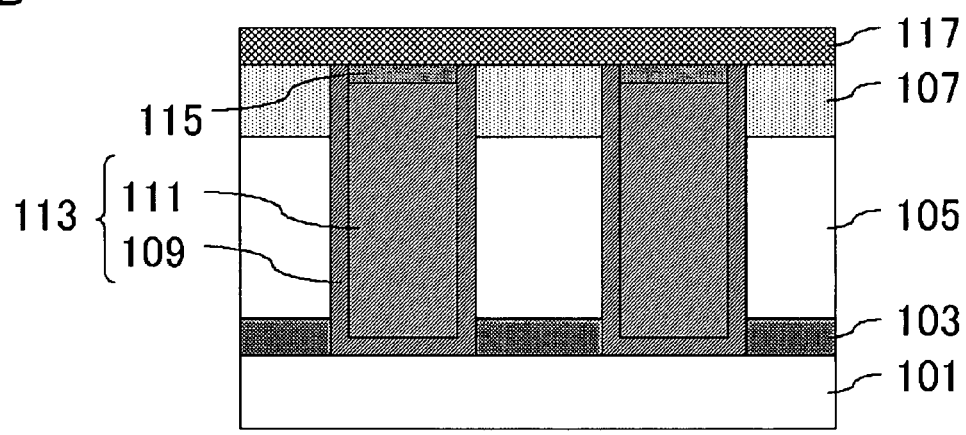

FIG. 4A and FIG. 4B, are cross-sectional views, illustrating a process for manufacturing the semiconductor device 100 in the present embodiment. Also in the present embodiment, the Si unevenly distributed layer 153 is first formed in the vicinity of the surface of the first copper interconnect 111, similarly as in the first embodiment, via the procedure described above in reference to FIG. 2A to FIG. 2B.

Next, as shown in FIG. 4A, the SiC film 117 is formed on the entire upper surface of the $SiO_2$ film 107 having the Si unevenly distributed layer 153 formed thereon. In this case, the SiC film 117 is formed to have a film density that allows a permeation of oxygen through the SiC film 117. More specifically, the SiC film 117 is formed to have a specific dielectric constant k of not less than 2.8 and less than 4. Having the specific dielectric constant of equal to or higher than 2.8, further improved manufacturing stability of the film can be provided. Besides, having the specific dielectric constant of less than 4, oxygen can be more preferably supplied into the Si unevenly distributed layer 153 through the SiC film 117, and the dielectric constant of the insulating interlayer can be more effectively reduced. On the other hand, in view of more surely suppressing creation of Cu—O bond by further suppressing diffusion of excessive oxygen, a specific dielectric constant of the SiC film 117 may alternatively be equal to or higher than 4.

Subsequently, as shown in FIG. 4B, at least a portion of, or preferably the whole of, the Si unevenly distributed layer 153 forms the Si—O unevenly distributed layer 115. More specifically, silicon in the Si unevenly distributed layer 153 partially form Si—O bond. The Si—O unevenly distributed layer 115 may be formed by, for example, a heat treatment process after the deposition of SiC film 117. The heat treatment process after the deposition of SiC film 117 may be conducted at a temperature of, for example, about 350 degree C. within an atmosphere having oxygen partial pressure of, for example, about $1 \times 10^{-6}$ atm to $1 \times 10^{-4}$ atm.

Thereafter, an upper layer is formed by employing the procedure described above in reference to FIG. 3C. In this way, the semiconductor device 100 (FIG. 1) is obtained.

Since the Si—O unevenly distributed layer 115 is also formed by in the vicinity of the surface in the inside of the first copper interconnect 111 in the present embodiment, advantageous effects similar to that obtained in the first embodiment can be obtained.

Third Embodiment

While the configuration that silicon in the Si unevenly distributed layer 153 forms Si—O bond is illustrated in the first embodiment, silicon in the Si unevenly distributed layer 153 may form Si—O bond or Si—N bond.

FIG. 5 is a cross-sectional view, illustrating configuration of such type of semiconductor device. Fundamental configurations of the semiconductor device 110 shown in FIG. 5 are similar to that of the semiconductor device 100 shown in FIG. 1, except that silicon injected in the vicinity of the surface in the inside of the first copper interconnect 111 at least partially forms Si—N bond in the semiconductor device 110. Further, in the semiconductor device 110, Si—N bond is present in the vicinity of the surface in the inside of the SiO$_2$ film 107.

More specifically, in the semiconductor device 110, an Si—O and Si—N unevenly distributed layer 145 is formed in the vicinity of the surface in the inside of the first copper interconnect 111. The Si—O and Si—N unevenly distributed layer 145 is a thin layered region containing Si—O bond and Si—N bond. In addition to above, a distribution of Si—N bond in the Si—O and Si—N unevenly distributed layer 145 is not particularly limited, and for example, Si—N bond and Si—O bond may be distributed in the entire Si—O and Si—N unevenly distributed layer 145. Alternatively, Si—N bond may be present in a portion of the Si unevenly distributed layer 153 or more specifically in a layered region of a predetermined depth from the surface of the first copper interconnect 111, and Si—O bond may be present in the entire Si unevenly distributed layer 153. In this case, the thickness of the unevenly distributed region of Si—N bond is thinner than the thickness of the unevenly distributed region of Si—O bond, and Si—N bond is concentrated in the vicinity of the surface of the first copper interconnect 111. Having such configuration, excessive oxidization of the first copper interconnect 111 can be more surely suppressed.

Alternatively, the semiconductor device 110 may be configured that silicon injected in the first copper interconnect 111 totally form Si—O bond or Si—N bond. This can provide a condition, in which no excessive silicon is present in a status of atomic silicon in the Si—O and Si—N unevenly distributed layer 145. Consequently, a diffusion of silicon in the Si—O and Si—N unevenly distributed layer 145 into the inside of the copper interconnect 111 can be more surely suppressed.

Figure 6A:
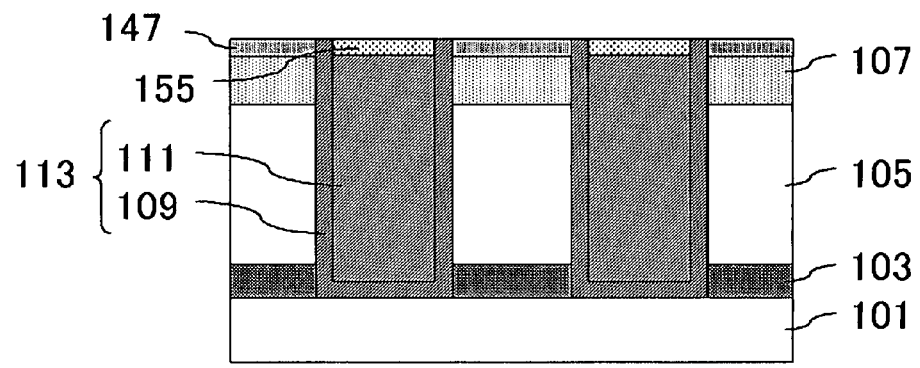
FIGS. 6A to 6C are cross-sectional views of the semiconductor device, illustrating a process for manufacturing of the semiconductor device of FIG. 5.
Figure 6B:
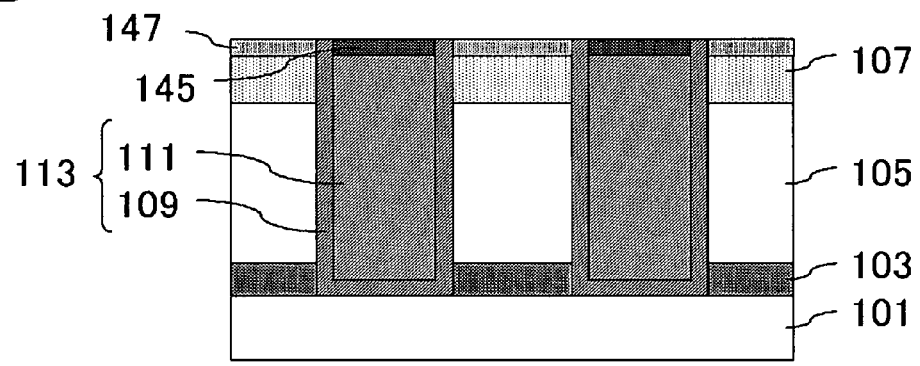
Figure 6C:
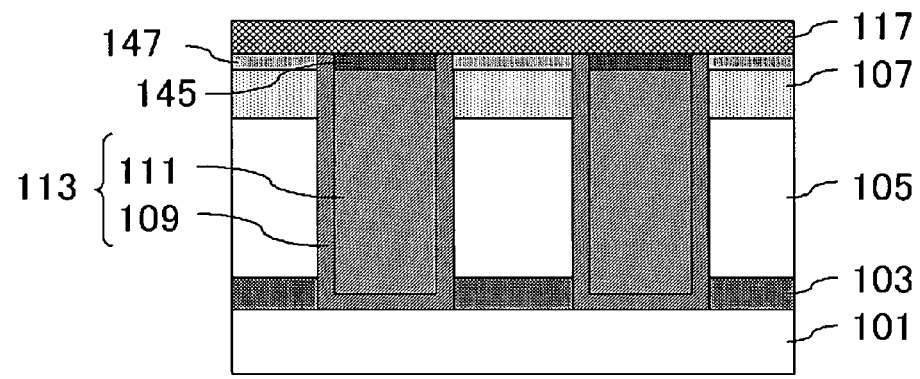

Next, a process for manufacturing the semiconductor device 110 will be described. FIG. 6A to FIG. 6C are cross-sectional views, illustrating a process for manufacturing the semiconductor device 110.

The procedure for manufacturing the semiconductor device 100 described above in the first embodiment may be employed for basic steps in the manufacture of the semiconductor device 110. However, the present embodiment additionally includes an operation (step 21) for at least partially forming Si—N bond from injected silicon after the step 14 for injecting silicon and before the step 15 for forming Si—O bond. Further, in the operation for forming Si—N bond in the step 21, Si—N bond is formed in the vicinity of the surface in the inside of the SiO$_2$ film 107.

More specifically, the SiCN film 103, the SiOC film 105 and the SiO$_2$ film 107 are formed on the silicon substrate 101 by the method described above in the first embodiment in reference to FIG. 2A to FIG. 2C, and the barrier metal film 109 and the first copper interconnect 111 are formed within these films. Then, silicon is injected in the vicinity of the surface of the first copper interconnect 111 to form the Si unevenly distributed layer 153 (FIG. 2C).

Next, as shown in FIG. 6A, a nitridation of the entire surface of the SiO$_2$ film 107 having the Si unevenly distributed layer 153 formed therein is conducted. More specifically, the upper portion of the first copper interconnect 111 is exposed to a gas containing nitrogen-source such as ammonia and the like under a condition for generating a plasma. By conducting the nitridation process, silicon injected in the first copper interconnect 111 at least partially forms Si—N bond, and the Si unevenly distributed layer 153 at least partially forms the Si—N unevenly distributed layer 155. Further, in this case, Si—N bond is also formed in the vicinity of the surface in the inside of the SiO$_2$ film 107. By forming the Si—N unevenly distributed layer 155 prior to the oxidation process, supply of excessive oxygen to the inside of the first copper interconnect 111 can be intercepted.

Subsequently, as shown in FIG. 6B, an oxidation of the Si—N unevenly distributed layer 155 is conducted to form the Si—O and Si—N unevenly distributed layer 145 from at least a portion of the Si—N unevenly distributed layer 155. The oxidation process may be conducted by, more specifically, a process for forming the Si—O unevenly distributed layer 115 employed in the first embodiment.

Further, the oxidation process may be preferably conducted via a milder processing such as a thermal processing and the like. The oxidation process is conducted by a thermal processing, so that unwanted formation of Si—O from Si—N bond in the surface layer of the SiO$_2$ film can be prevented, as compared with a strong oxidation process such as an oxygen plasma and the like. Further, if the oxidation process by such thermal processing is employed, a formation of Cu—O bond in the first copper interconnect 111, which is otherwise occurred in the case of employing a strong oxidation process such as an oxygen plasma process, can be avoided.

Then, as shown in FIG. 6C, the SiC film 117 is formed on the entire upper surface of the SiO$_2$ film 107 having the Si—O and Si—N unevenly distributed layer 145 formed therein. It is preferable that the whole of the Si unevenly distributed layer 153 forms the Si—O and Si—N unevenly distributed layer 145 at a stage when the formation of the SiC film 117 is completed. Thereafter, the procedure described above in reference to FIG. 3C is conducted to obtain the semiconductor device 110 shown in FIG. 5.

In the present embodiment, the nitridation process of the upper surface of the first copper interconnect 111 is conducted prior to the oxidization of the Si unevenly distributed layer 153, so that partial nitridation of silicon in the Si unevenly distributed layer 153 is conducted to form the Si—N unevenly distributed layer 155. By forming the Si—N unevenly distributed layer 155 before the oxidation process, excessive injection of oxygen into the first copper interconnect 111 can be prevented in the oxidation process after the nitridation process. Consequently, an excessive oxidization of the first copper interconnect 111 can be suppressed. Thus, an oxidation of unreacted silicon in the first copper interconnect 111 can be ensured and an oxidization of copper can be more surely suppressed. Further, since the Si—N unevenly distributed layer 155 is formed by the nitridation process, silicon contained in the Si unevenly distributed layer 153 can be surely remained in the vicinity of the surface of the first copper interconnect 111.

Further, in the present embodiment, Si—N bond may be also formed in the vicinity of the surface in the inside of the SiO$_2$ film 107 by conducting the nitridation process to obtain a nitride layer 147. Consequently, a further improved mechanical strength of the insulating interlayer in the vicinity of the upper surface of the first copper interconnect 111 can be achieved.

Figure 7A:
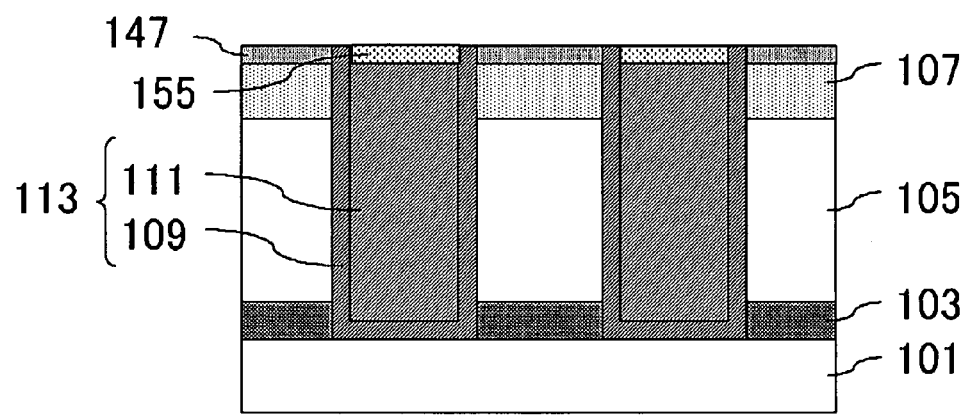
FIGS. 7A and 7B are cross-sectional views of the semiconductor device, illustrating a process for manufacturing of the semiconductor device of FIG. 5.
Figure 7B:
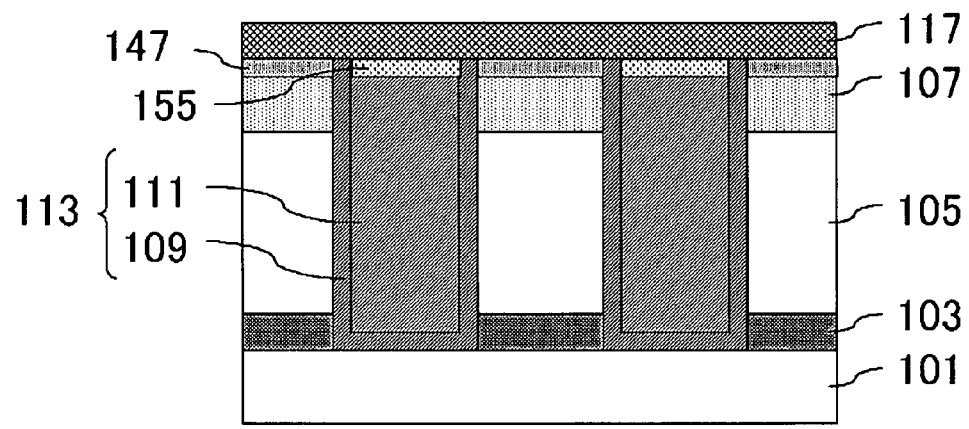

In addition to above, in the present embodiment, an oxidation process of silicon injected in the first copper interconnect 111 may also be conducted after the SiC film 117 is formed on the first copper interconnect 111, as in the second embodiment. FIG. 7A and FIG. 7B are cross-sectional views, illustrating a procedure for manufacturing the semiconductor device 110 by employing a process described in the second embodiment. As shown in FIG. 7A, the Si—N unevenly distributed layer 155 and the nitride layer 147 are formed in the vicinity of the surface in the inside of the first copper interconnect 111 and the SiO$_2$ film 107, respectively. Next, as shown in FIG. 7B, the SiC film 117 is formed on the SiO$_2$ film 107. Then, for example, by employing the process described in the second embodiment, silicon injected in the first copper interconnect 111 through SiC film 117 is oxidized to form the Si—O and Si—N unevenly distributed layer 145.

While the case that the silicon-doped region is formed in the vicinity of the surface in the inside of the underlying first copper interconnect 111 has been described as exemplary implementations in the above-described embodiments, a region doped with injected silicon may be similarly provided in the vicinity of the surface in the inside of the overlying second interconnect 139.

Fourth Embodiment

While the exemplary implementations having the configurations, in which the bottom surface of the connecting plug 127 is positioned to be substantially coplanar with the upper surface of the first copper interconnect 111, have been described in the above-mentioned embodiments, the position of the bottom surface of the connecting plug 127 is not limited thereto, and a vicinity of the bottom surface of the connecting plug 127 may be embedded within the first copper interconnect 111.

More specifically, a semiconductor device of the present embodiment includes an electroconductive connecting plug 127 provided on the first copper interconnect 111. The bottom of the connecting plug 127 is positioned in, for example, a region doped with injected silicon in the vicinity of the surface in the inside of the first copper interconnect 111 (Si—O unevenly distributed layer 115).

For example, in the present embodiment, the bottom surface of the connecting plug 127 may be positioned to be substantially coplanar with the bottom surface of the region doped with silicon (Si—O unevenly distributed layer 115).

Further, in the present embodiment, the bottom of the connecting plug 127 may be positioned in the side closer to the silicon substrate 101 in the inside of the first copper interconnect 111 than the region doped with silicon (Si—O unevenly distributed layer 115).

Following description will be made by presenting an exemplary implementation of a semiconductor device, which is similar to that of the semiconductor device 100 of the first and second embodiments, except that the connecting plug 127 penetrates the Si unevenly distributed layer 153, the bottom of the connecting plug 127 is embedded in the Si—O unevenly distributed layer 115, and the bottom surface thereof is located to be substantially coplanar with the bottom surface of the Si—O unevenly distributed layer 115.

FIG. 15 is a cross-sectional view, illustrating a configuration of a semiconductor device of the present embodiment. Fundamental configurations of the semiconductor device shown in FIG. 15 are similar to that of the semiconductor device 100 of the first and second embodiments, except that the position of the bottom surface of the connecting plug 127 is different therefrom, as described above.

In addition, in the semiconductor device shown in FIG. 15, the Si—O unevenly distributed region 157 is formed in the vicinity of the surface in the inside of the second interconnect 139 formed as the upper layer of the connecting plug 127, and the SiC film 159 serves as a barrier insulating film on the first copper interconnect 111.

The semiconductor device shown in FIG. 15 has a structure, obtained by forming the via bottom to be deeper than a region doped with injected silicon in the vicinity of the surface in the inside of the first copper interconnect 111 by controlling a via etching condition for forming a via hole being plugged with the connecting plug 127.

Such structure may be obtained by employing the process described in the first and second embodiments. However, the method for manufacturing such structure includes an operation for forming the connecting plug 127 for coupling to the first copper interconnect 111 above the first copper interconnect 111 (step 22), and the step 22 includes: an operation for forming a connecting hole extending through the SiC film 117 and elongating across the inside of the first copper interconnect 111; an operation for forming an electrically conducting film so as to plug such connecting hole; and an operation for removing the electrically conducting film formed outside the connecting hole. Then, in the operation for forming the connecting hole, a through hole is formed so that a bottom surface of the connecting hole is located to be closer to the silicon substrate 101 than the upper surface of the first copper interconnect 111.

According to the present embodiment, an increase in via electrical resistance is suitably suppressed, as compared with the structure of the semiconductor device 100 shown in FIG. 1. In addition, since a silicon-doped region is present in the first copper interconnect 111 and the SiC film 117 serving as a barrier insulating film, a life time-improvement effect, which is similar to that of the semiconductor devices described in the above-described embodiments can be obtained.

Fifth Embodiment

Figure 16:
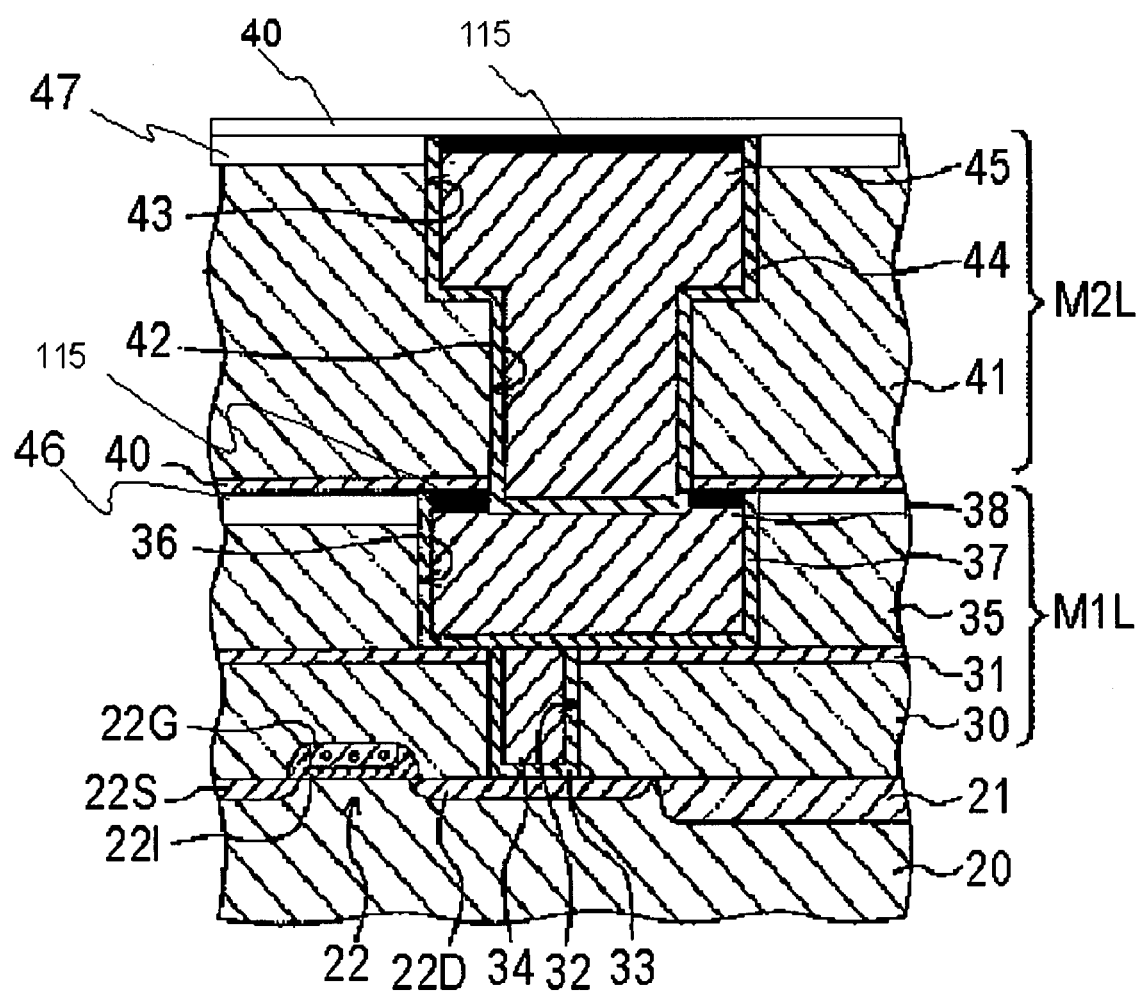
FIG. 16 is a cross-sectional view of a semiconductor device, illustrating a configuration of a semiconductor device in the present embodiment.

FIG. 16 is a cross-sectional view, illustrating an exemplary implementation which formed a Cu interconnect on a metal oxide semiconductor field effect transistor (MOSFET). More specifically, FIG. 16 shows a cross-sectional view of a MOSFET 22, a first level interconnect layer M1L and a second level interconnect layer M2L. The MOSFET 22 is formed in an active region. The MOSFET 22 is configured to include a source region 22S, a drain region 22D, a gate insulating film 22I and a gate electrode 22G. An element isolation insulating film is indicated by 21.

An insulating interlayer 30 composed of $SiO_2$ and an etch stop film 31 composed of SiCN are formed so as to cover the MOSFET 22. A via hole 32 extending through the insulating interlayer 30 and the etch stop film 31 is formed in a location corresponding to the drain region 22D. An inner surface of the via hole 32 is coated with a barrier metal layer 33 composed of titanium nitride (TiN). The interior of the via hole 32 is filled with a plug 43 composed of tungsten.

An insulating interlayer 35 composed of SiOC and an $SiO_2$ film 46, for example, are formed on the etch stop film 31. An interconnect trench 36 reached to the etch stop film 31 is formed in such insulating interlayer 35. The interconnect trench 36 passes through a position where a plug 34 is disposed. Ta-containing barrier metal layer 37, for example, covers the bottom surface and the side surfaces of the interconnect trench 36. The interior of the interconnect trench 36 is filled with an interconnect 38 composed of copper. The insulating interlayer 30, the insulating interlayer 35, the plug 34, the interconnect 38 and the like constitute the first level interconnect layer M1L.

A barrier layer 40 composed of SiCN is formed over the first level interconnect layer M1L. An insulating interlayer 41 composed SiOC and an $SiO_2$ film 47 are formed on the barrier layer 40. The insulating interlayer 41 and the barrier layer 40 are provided with a via hole 42 reached to the first level interconnect layer M1L. Further, the interconnect trench 43 reached to the halfway in the depth direction is formed in the insulating interlayer 44. The interconnect trench 43 passes through the position where the via hole 42 is disposed.

The Ta-containing barrier metal layer 44 covers inner surfaces of the interconnect trench 43 and the via hole 42. The interiors of the interconnect trench 43 and the via hole 42 are filled with an interconnect 45 composed of copper. The insulating interlayer 41, the interconnect 45 and the like constitute the second level interconnect layer M2L. A barrier layer 40 composed of, for example, SiCN is formed over the second level interconnect layer M2L.

The Si—O unevenly distributed layer 115 is formed around the surface of the first level interconnect layer M1L and the second level interconnect layer M2L, respectively.

In the present example, the first level interconnect layer M1L is formed via a single damascene process, and the second level interconnect layer M2L is formed via a known dual damascene process. Further, no etch stop film is employed in the second level interconnect layer. Alternatively, the second level interconnect layer M2L may be formed via a single damascene process, and an etch stop film may be employed for the second level interconnect layer.

While the preferred embodiments of the present invention have been described above in reference to the annexed figures, it should be understood that the disclosures above are presented for the purpose of illustrating the present invention, and various configurations except the above-described configurations may also be adopted.

For example, while the configuration of the insulating interlayer containing the SiOC film 105 as the low dielectric constant insulating film is illustrated in the above-mentioned embodiments, available low dielectric constant insulating film is not limited to the SiOC film 105, a polyorganosiloxane film, a hydrogenated siloxane film, or a porosified films thereof may also be employed. A method for manufacturing these films is not particularly limited, and such film may be typically formed via, for example, a chemical vapor deposition (CVD) process or a coating process.

Typical polyorganosiloxane includes, for example: methyl poly siloxane such as methyl silsesquioxane (MSQ); hydrogenated methyl poly siloxane such as (methyl hydrogen silsesquioxane (MHSQ); organo-silicate glass (OSG); and carbon doped oxide (CDO).

Typical hydrogenated siloxane includes, for example: hydrogen silsesquioxane (HSQ); and ladder oxide such as ladder hydrogenated siloxane. Among these, ladder hydrogenated siloxane is a polymer having a ladder-shaped molecular structure, and preferably has a dielectric constant of equal to or lower than 2.9 in view of preventing an interconnect delay, and preferably has a lower film density. For example, a film density may preferably be not less than 1.50 $g/cm^2$ and not more than 1.58 $g/cm^2$, and a refractive index at a wave length of 633 nm may preferably be not less than 1.38 and not more than 1.40. As a specific example of such film material, L-Ox referred to as a ladder oxide may be illustrated. In addition to above, an insulating material made from a porosified L-Ox may also be employed.

In addition, typical low dielectric constant insulating film includes films of:

a parylene-type resin;

a fluorocarbon-type resin such as CYTOP (registered trademark);

non-fluorine-containing-type aromatic organic resin such as SiLK (registered trademark);

Polyarylether (PAE); and organic resins such as polyphenylene.

A specific dielectric constant of the low dielectric constant insulating film may be, for example, equal to or lower than 3.5, and preferably equal to or lower than 3. In addition, the low dielectric constant insulating film may be a film including silicon (Si), oxygen (O) and hydrogen (H) as constituent element. Alternatively, the low dielectric constant insulating film may be a film including silicon (Si), carbon (C), oxygen (O) and hydrogen (H) as constituent element.

While the semiconductor device provided with the copper interconnect has been described as the exemplary implementation in the above-mentioned embodiments, it is sufficient if the interconnect is composed of a copper-containing metal. In addition, the process for forming the interconnect is not limited to a plating process, and a CVD process, for example, may be employed.

EXAMPLES

Experimental Example 1

A semiconductor device 110 described in the third embodiment was manufactured (device 1). In the manufacture of the device 1, a pre-processing for a first copper interconnect 111 was conducted as sequentially conducting: an ammonia plasma-processing; injection of silicon; nitridation; oxidization; and formation of an SiC film 117.

Figure 8:
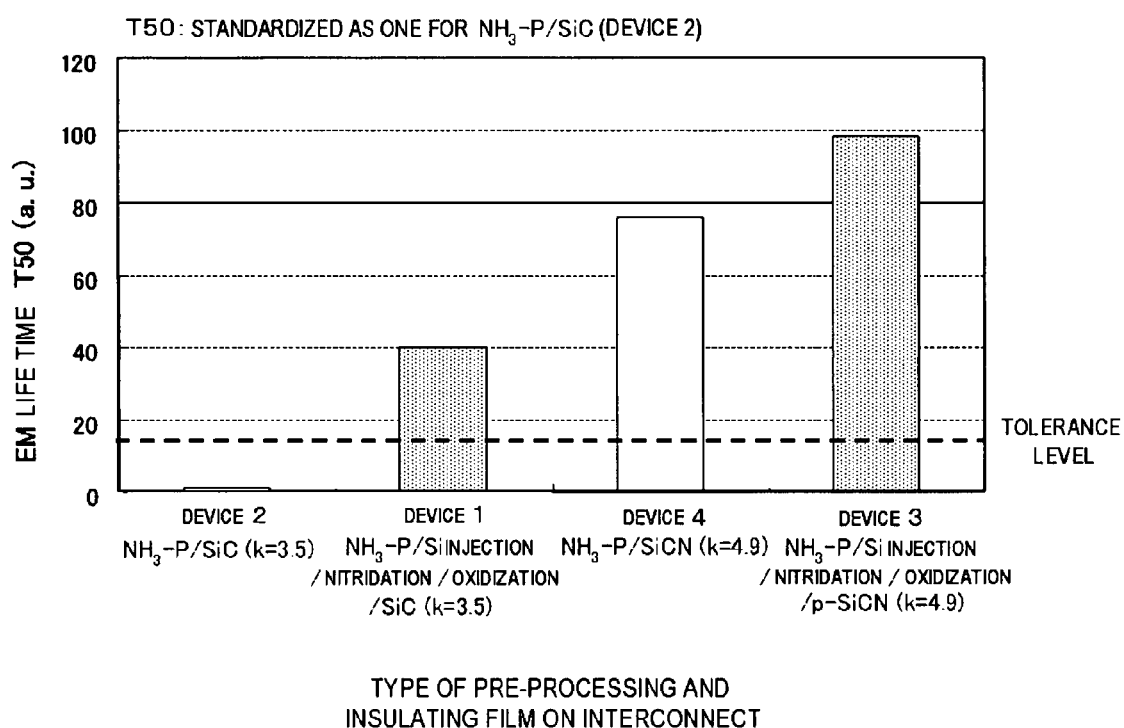
FIG. 8 is a bar chart, showing results of evaluations on EM of the semiconductor devices in examples.

In addition, after the first copper interconnect 111 was formed by employing the method for manufacturing the semiconductor device 110, only a reduction processing employing ammonia plasma was carried out without conducting a formation of the Si unevenly distributed layer 153 and an oxidation process thereof to manufacture a semiconductor device (device 2: represented by "$NH_3$—P" in graph of FIG. 8).

Further, a semiconductor device having a configuration similar to that of the device 1 except that an SiCN film was employed in place of the SiC film 117 for the barrier insulating film on the first copper interconnect 111 was manufactured (device 3). In addition, a semiconductor device having a configuration similar to that of the device 2 except that an SiCN film was employed as a barrier insulating film on the first copper interconnect 111 was manufactured (device 4).

In the manufacture, of the device 1 to the device 4, an ammonia plasma processing (at a temperature of 200 to 300 degree C. for 1 to 30 seconds) was conducted in a reduction processing of the surface of the first copper interconnect 111.

In addition, in the manufacture of the device 1 and the device 3, an injection of silicon was conducted by subjecting the device to $SiH_4$ (gas includes $SiH_4$ in volumetric flow rate of about 30 to 100 sccm and nitrogen ($N_2$) in volumetric flow rate of about 500 to 1,000 sccm) for 1 to 30 seconds a temperature of 200 to 300 degree C. at a pressure of 1 to 10 Torr. In addition, in the manufacture of the device 1 and the device 3, an ammonia plasma-processing (at 200 to 300 degree C. for 1 to 30 seconds) was conducted in a nitridation process of the first copper interconnect 111. In addition, in the manufacture of the device 1 and the device 3, an oxidation process of the first copper interconnect 111 was conducted by heating the silicon substrate 101 at 300 to 350 degree C. at an oxygen partial pressure of $1 \times 10^{-7}$ to $1 \times 10^{-5}$ atm for 5 to 30 seconds.

Figure 9:
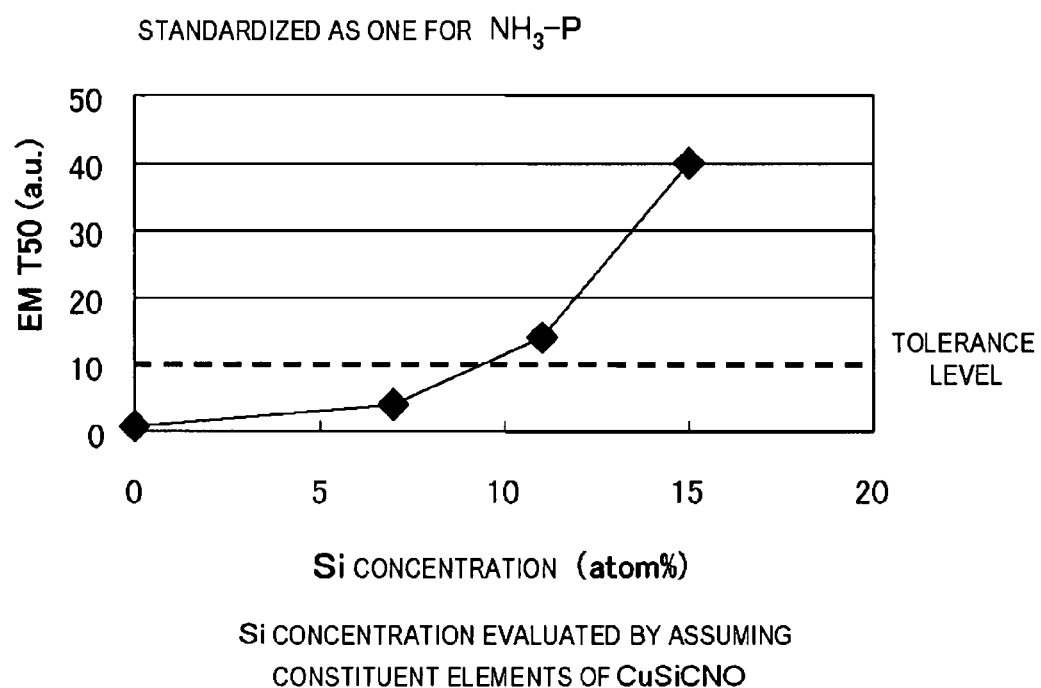
FIG. 9 is a graph, showing results of evaluations on EM of the semiconductor devices in examples.

EM life time between interconnects was evaluated for these devices. FIG. 8 and FIG. 9 are graphs, showing evaluation results of the EM life time for the connecting plugs. In FIG. 8 and FIG. 9, the EM life time was standardized so that the EM life time of the device 2 was one, and was illustrated in ordinate.

FIG. 8 includes results of electromigration (EM) life time T50 for fraction defective 50% (a.u.), which can be generally classified into two cases of: a case employing an SiC (k=3.5) film for a barrier insulating film (devices 1 and 2) with the device 2 that reduction processing with an ammonia plasma was conducted as a pre-processing of a deposition and with device 1 that the technology described in the third embodiment as the pre-processing; and a case of employing SiCN (k=4.9) film for a barrier insulating film (devices 3 and 4), with the device 4 that reduction processing with an ammonia plasma was conducted as a pre-processing of a deposition and with device 3 that the technology described in the third embodiment as the pre-processing.

In ordinates of FIG. 8 and FIG. 9, the EM life time of the device 2, which employed the SiC (k=3.5) film and was manufactured by conducting an ammonia plasma as a pre-processing of the deposition, was standardized to one.

As can be seen from FIG. 8, in case of the device 1 that employed the SiC (k=3.5) film for the barrier insulating film on the interconnect and was manufactured by applying the technology of the third embodiment, about 40-fold improvement in life time was confirmed, as compared with the device 2 manufactured by conducting only an ammonia plasma-processing, and thus a tolerance level was cleared.

In addition, when the barrier insulating film on the interconnect was SiCN (k=4.9) film, 76-fold improvement in EM life time was confirmed even in the case of device 4, which was manufactured by conducting only an ammonia plasma-processing, as compared with the case of employing SiC (k=3.5), and a tolerance level was cleared if the dielectric constant k was equal to or higher than 4.0.

In addition, in the device 3 manufactured by employing the technology of the third embodiment, further improvement in the life time was confirmed, and 98-fold improvement was obtained.

In addition to above, silicon concentration in the Si unevenly distributed layer 153 in the device 1 and the device 3 was about 15 atomic %.

FIG. 9 is a graph, showing a relationship of silicon concentration in the Si unevenly distributed layer 153 with T50 (a.u.). In addition to above, the silicon concentration was calculated as Si concentration in the whole constituent element, by assuming that constituent elements of the Si unevenly distributed layer 153 was Cu/Si/C/N/O. As can be seen from FIG. 9, EM can be more effectively suppressed by selecting Si concentration in the Si unevenly distributed layer 153 as equal to or higher than about 10 atomic %.

In addition to above, while $SiH_4$ gas was employed for as a source gas for injecting silicon, similar Si injection may be conducted by employing:

inorganic silane such as disilane ($Si_2H_6$), dichlorosilane ($SiH_2Cl_2$), tetrachloro silane ($SiCl_4$) and the like; and organosilane such as monomethyl silane, trimethylsilane, tetramethylsilane and the like. In particular, an use of $Si_2H_6$ provides further advantage of allowing an injection of Si at lower temperature.

Experimental Example 2

A break-down voltage resistance between the first copper interconnects 111 was measured in each of the device 1 and the device 2 of the experimental example 1. More specifically, break-down voltage resistance was investigated when electric field was formed between the first interconnects 113. In addition to above, an average value of 20 measurement samples was obtained for each of the device 1 and the device 2.

Figure 10:
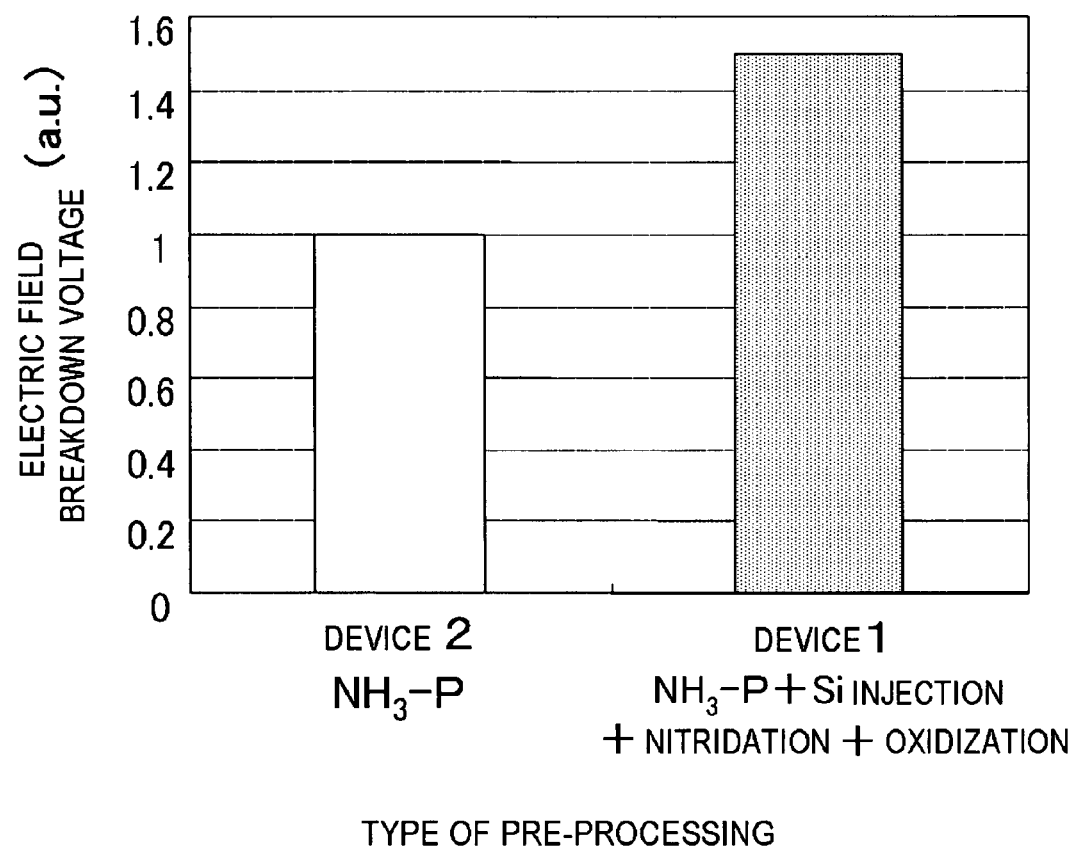
FIG. 10 is a bar chart, showing results of evaluations on breakdown voltage of the semiconductor devices in examples.

Results are shown in FIG. 10. In ordinate of FIG. 10, a breakdown voltage was standardized by assuming the breakdown voltage of the device 2 as one. According to FIG. 10, 1.5-fold improvement in electric field breakdown voltage was obtained in the device 1, over the device 2.

Experimental Example 3

The multiple-layered film, which was pursuant to the configuration of the semiconductor device described in the third embodiment, was formed. More specifically, a copper film was formed on the silicon substrate. After the copper film was formed, a surface thereof was treated with an ammonia plasma, and then was exposed to $SiH_4$ gas, and further, a nitridation and an oxidization thereof were carried out (multiple-layered film 1). Meanwhile, a copper film was formed on another silicon substrate. A multiple-layered film having a surface treated with an ammonia plasma after the copper film was formed was also manufactured (multiple-layered film 2).

In addition to above, respective process conditions for the reduction process for the copper films of the multiple-layered film 1 and the multiple-layered film 2, and the injection processing of silicon, the nitridation process and the oxidation process for the multiple-layered film 1 were selected to be similar to that in Example 1.

Figure 11A:
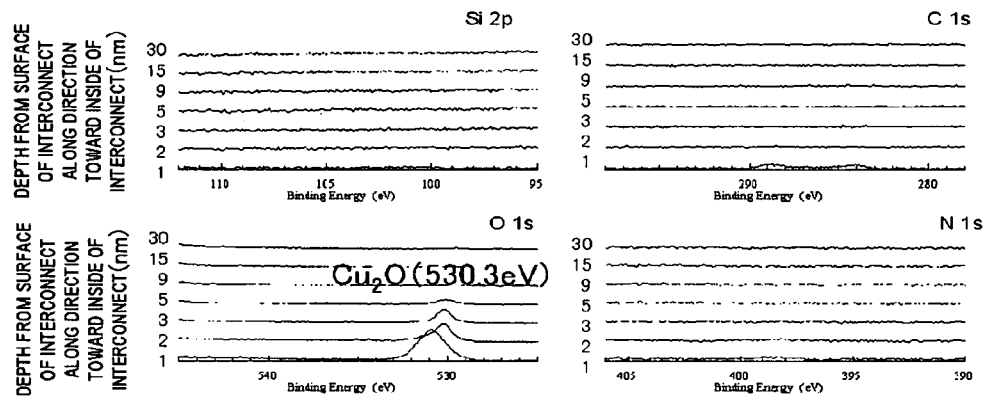
FIGS. 11A and 11B are charts of XPS analysis results for the semiconductor devices in examples.
Figure 11B:
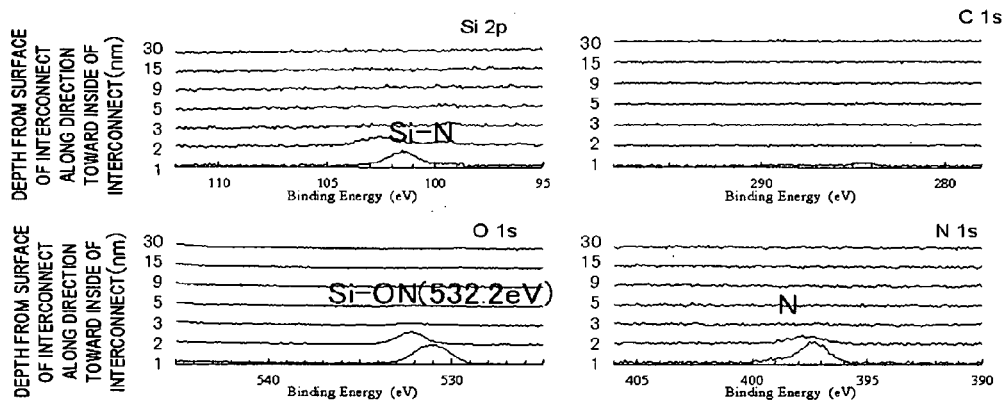

Measurements of the surface of these multiple-layered films via a x-ray photoelectron spectroscopy (XPS) were conducted to investigate chemical bonds contained in the copper surface. FIG. 11A and FIG. 11B show measurement results of the multiple-layered film 2 and the multiple-layered film 1, respectively. As can be seen from FIG. 11A, a reduced copper is re-oxidized in the multiple-layered film 2, which exhibits a peak of Cu—O bond (530.3 eV) created in a location of a depth of about 10 mm.

On the contrary, as shown in FIG. 11B, a peak of Cu—O bond is not larger than the minimum detectable quantity in the multiple-layered film 1, which indicates that a reoxidation of copper is inhibited. In addition, peaks corresponding to Si—ON bond (532.2 eV) and Si—N bond appear in the chart, and thus it can be considered that Si—O and Si—N unevenly distributed layer is formed on the surface of the copper film. In addition, it is suggested from the chart that a depth of a region of forming Si—ON bond from the surface of the first copper interconnect 111 is larger than a depth of a region of forming Si—N bond from the surface of the first copper interconnect 111.

Further, it is suggested from FIG. 11A and FIG. 11B that a depth of the region of forming Cu—O bond in the multiple-layered film 2 is deeper than a depth of the region of forming Si—ON bond in the multiple-layered film 1.

Further, the copper film in the multiple-layered film 1 was evaluated via a x-ray diffraction (XRD), and no signal resulted from copper silicide was confirmed.

In addition to above, it is expected in the multiple-layered film 1 that, even if the diffusion barrier film and/or the insulating interlayer are formed on the copper film after the oxidation process of copper, the condition of containing substantially no Cu—O bond in the vicinity of the surface in the inside of the copper film is still maintained.

Experimental Example 4

Figure 12:
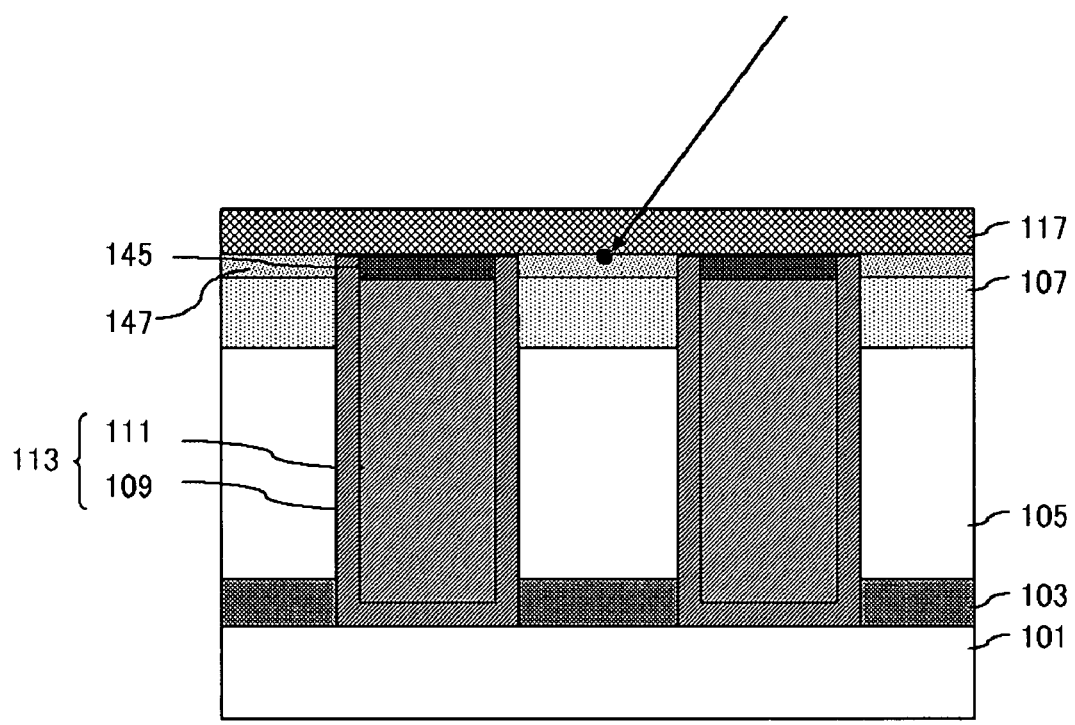
FIG. 12 is a cross-sectional view of a semiconductor device, illustrating a position for conducting an EELS analysis for the semiconductor devices in examples.
Figure 13:
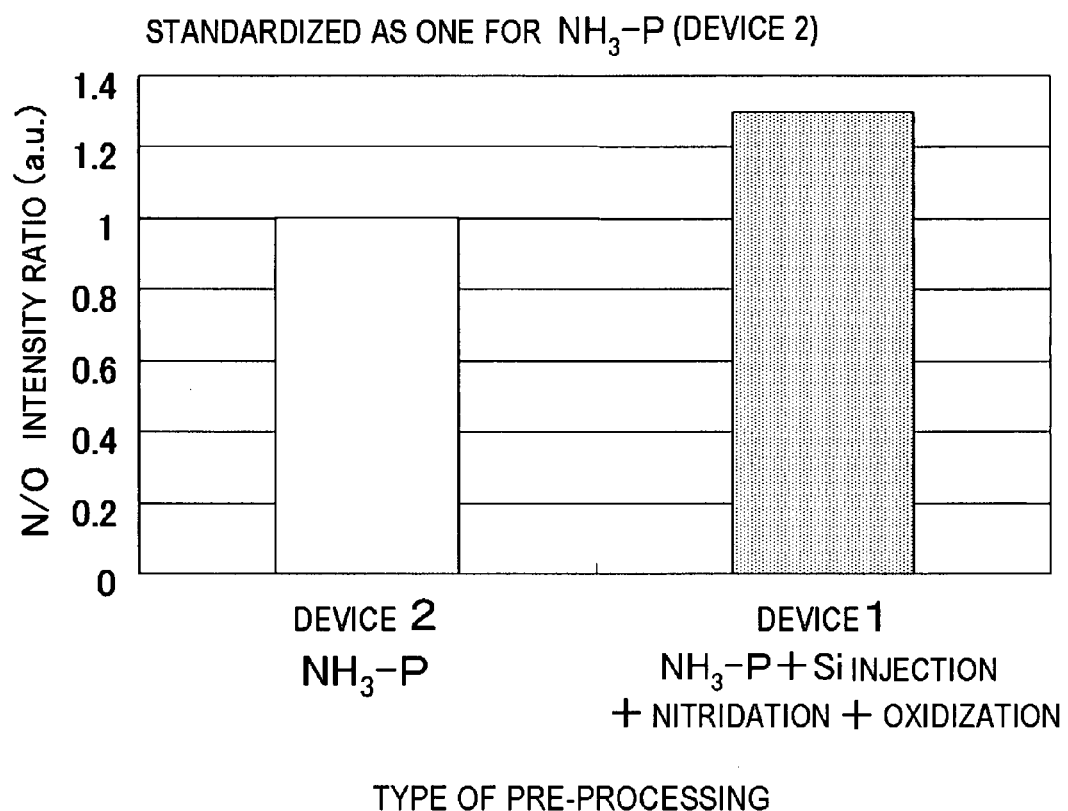
FIG. 13 is a bar chart, showing results of TEM-EELS analysis for the semiconductor devices in examples.

Transmission electron microscopy (TEM)-electron energy loss spectroscopy (EELS) analysises were conducted at a position shown in FIG. 12 for the device 1 and the device 2 described above in the experimental example 1 to obtain N/O intensity ratio. Results are shown in FIG. 13. In FIG. 13, N/O intensity ratio is standardized as N/O intensity ratio for the device 2 is one. It can be seen from FIG. 13 that nitrogen content in the surface of the first copper interconnect 111 of the device 1 is higher than that of the device 2.

In addition to above, a TEM observation for the device 1 was conducted, and no formation of a silicide layer in the vicinity of the surface of the first copper interconnect 111 was confirmed.

Experimental Example 5

A device having similar configuration as the device 1 manufactured in the experimental example 1 was manufactured, except that an SiCN film having a specific dielectric constant k=4.9 was formed in place of the SiC film 117 (device 3). Interconnect Capacitances for the device 1 and the device 3 were evaluated. The evaluations were conducted for a configuration having a line and space (L/S) in the first copper interconnect 111 of 120 nm/120 nm, and a configuration having L/S of 100 nm/100 nm.

Figure 14:
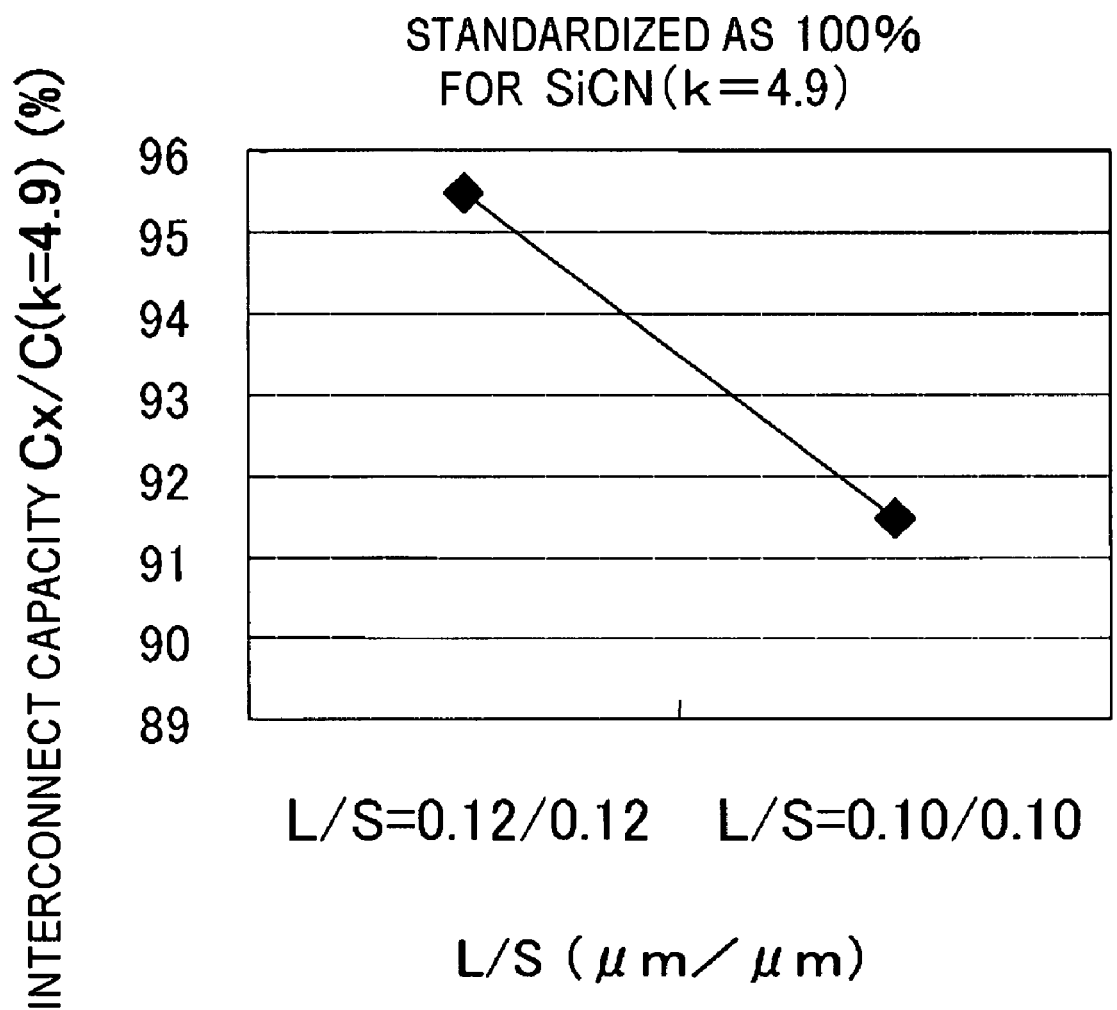
FIG. 14 is a graph, showing results of measured interconnect capacitances for the semiconductor devices in examples.

Results are shown in FIG. 14. In FIG. 14, the interconnect capacitance is standardized as the interconnect capacitance of device 3 having an SiCN film of specific dielectric constant k=4.9 is 100%. It can be seen from FIG. 14 that a reduced interconnect capacitance can be provided, as compared with the case of employing the SiCN film, by employing the SiC film 117 for a barrier insulating film formed on the first copper interconnect 111.

It is apparent that the present invention is not limited to the above embodiment, and may be modified and changed without departing from the scope and spirit of the invention.

What is claimed is:

1. A semiconductor device, comprising:
   a substrate;
   a first insulating film provided on said substrate;
   an interconnect, provided in said first insulating film, and essentially composed of a copper-containing metal;
   a region doped with injected silicon in the vicinity of a surface of said interconnect in the inside of said interconnect, wherein the injected atomic silicon at least partially forms silicon-oxygen (Si—O) bond; and
   a second insulating film on said region doped with injected silicon.

2. The semiconductor device according to claim 1, wherein said region doped with silicon is provided in the vicinity of the surface of said interconnect in the inside of said interconnect to form a layered structure.

3. The semiconductor device according to claim 1, wherein the injected atomic silicon at least partially creates Si—N bond.

4. The semiconductor device according to claim 3, wherein the injected atomic silicon substantially totally creates Si—O bond or Si—N bond.

5. The semiconductor device according to claim 3, wherein Si—N bond is included in the vicinity of the surface in the inside of said first insulating film in a region having none of said interconnect formed therein.

6. The semiconductor device according to claim 1, wherein a copper silicide layer is not formed in the vicinity of the surface of said interconnect in the inside of said interconnect.

7. The semiconductor device according to claim 1, wherein ratio of silicon to the whole elements constituting said interconnect contained in the vicinity of the surface of said interconnect in the inside of said interconnect is not less than 5 atomic % and not more than 30 atomic.

8. The semiconductor device according to claim 1, wherein said first insulating film includes a low dielectric constant film.

9. The semiconductor device according to claim 1, wherein said second insulating film is also on said first insulating film so as to be in contact with said interconnect, and
   wherein said second insulating film is selected from a group consisting of a silicon carbide (SiC) film, a silicon carbonitride (SiCN) film, a silicon oxycarbide (SiCO) film, a silicon oxycarbonitride (SiCON) film and a silicon nitride (SiN) film.

10. The semiconductor device according to claim 1, wherein substantially no Cu—O bond is included in the vicinity of the surface of said interconnect in the inside of said interconnect.

11. The semiconductor device according to claim 1, further comprising an electroconductive connecting plug on said interconnect, wherein a bottom of said connecting plug is located in said region doped with silicon.

12. The semiconductor device according to claim 1, further comprising an electroconductive connecting plug on said interconnect, wherein a bottom of said connecting plug is located in a position in the inside of said interconnect, which is closer to said substrate than said region doped with silicon.

13. A method for manufacturing a semiconductor device, comprising:
   forming a first insulating film on a substrate;
   forming an interconnect in said first insulating film, said interconnect being essentially composed of a copper-containing metal;
   inducing a reduction of copper in the vicinity of a surface of said interconnect;
   injecting silicon in the vicinity of a surface of said interconnect in the inside of said interconnect by exposing an upper portion of said interconnect to a gas containing silicon, after said inducing a reduction of copper;
   inducing silicon injected in said injecting silicon to create Si—O bond over a whole surface of said interconnect; and
   forming a second insulating film on a region doped with the injected silicon.

14. The method for manufacturing a semiconductor device according to claim 13, wherein said at least partially inducing injected silicon to create Si—O bond includes partially inducing silicon injected in the vicinity of the surface in the inside of said interconnect to create Si—O bond.

15. The method for manufacturing a semiconductor device according to claim 13, further comprising at least partially inducing injected silicon to create Si—N bond, after said injecting silicon and before at least partially inducing injected silicon to create Si—O bond.

16. The method for manufacturing a semiconductor device according to claim 15, wherein said at least partially inducing injected silicon to create Si—N bond includes inducing injected silicon to create Si—N bond in the vicinity of the surface in the inside of said first insulating film.

17. The method for manufacturing a semiconductor device according to claim 13,
   wherein said at least partially inducing injected silicon to create Si—O bond includes oxidizing the upper portion of said interconnect,
   wherein the step of forming the second insulating film includes forming the second insulating film in contact with said first insulating film having said interconnect formed therein, after said at least partially inducing injected silicon to create Si—O bond, and wherein said forming the second insulating film includes forming a film selected from a group consisting of an SiC film, an SiCN film, an SiCO film, an SiCON film and an SiN film.

18. The method for manufacturing a semiconductor device according to claim 13, wherein said at least partially inducing injected silicon to create Si—O bond includes oxidizing the upper portion of said interconnect, and wherein said oxidizing the upper portion of the interconnect includes heat-treating said substrate having said interconnect formed thereon.

19. The method for manufacturing a semiconductor device according to claim 13, wherein the step of forming the second insulating film includes forming the second insulating film in contact with said first insulating film having said interconnect formed therein, after said injecting silicon and before said at least partially inducing injected silicon to create Si—O bond, wherein said forming the second insulating film includes forming a film selected from a group consisting of: SiC film, SiCN film, SiCO film, SiCON film and SiN film, and wherein said at least partially inducing injected silicon to create Si—O bond includes diffusing oxygen to a vicinity of the surface in the inside of said interconnect through said second insulating film.

* * * * *